United States Patent [19]
Matsunami

[11] Patent Number: 5,463,246
[45] Date of Patent: Oct. 31, 1995

[54] LARGE SCALE HIGH DENSITY SEMICONDUCTOR APPARATUS

[75] Inventor: Mitsuo Matsunami, Nara, Japan

[73] Assignee: Sharp Kabushiki Kaisha, Osaka, Japan

[21] Appl. No.: 237,324

[22] Filed: May 3, 1994

Related U.S. Application Data

[63] Continuation of Ser. No. 933,582, Aug. 24, 1992, abandoned, which is a continuation of Ser. No. 456,865, Dec. 27, 1989, abandoned.

[30] Foreign Application Priority Data

| Dec. 29, 1988 | [JP] | Japan | 63-331990 |
| Jan. 18, 1989 | [JP] | Japan | 1-10731 |
| Sep. 4, 1989 | [JP] | Japan | 1-229047 |

[51] Int. Cl.$^6$ .................. H01L 23/48; H01L 21/44
[52] U.S. Cl. ............ 257/621; 257/624; 257/698; 257/774; 257/783; 437/203; 437/208; 437/228; 437/245
[58] Field of Search .................. 357/55, 68, 69; 257/507, 621, 624, 698, 774, 783; 437/203, 208, 228, 245

[56] References Cited

U.S. PATENT DOCUMENTS

| 3,648,131 | 3/1972 | Stuby | 357/68 |
| 4,417,392 | 11/1983 | Ibrahim et al. | 357/69 |
| 4,835,598 | 5/1989 | Higuchi | 257/697 |

FOREIGN PATENT DOCUMENTS 59-222954  12/1984  Japan.

*Primary Examiner*—Edward Wojciechowicz

[57] ABSTRACT

A large scale semiconductor apparatus is provided which includes at least one semiconductor chip having electrodes. The semiconductor chip is bonded on an electrically insulating circuit substrate on which electrically conductive interconnection films are separately formed, and a plurality of through holes are formed in the semiconductor chip so as to pierce the semiconductor chip in the direction of the thickness thereof. Electrically conductive bodies are formed in the through holes, respectively, wherein each of the conductive bodies electrically connects a predetermined electrode of the semiconductor chip to a predetermined interconnection film formed on the circuit substrate.

10 Claims, 35 Drawing Sheets

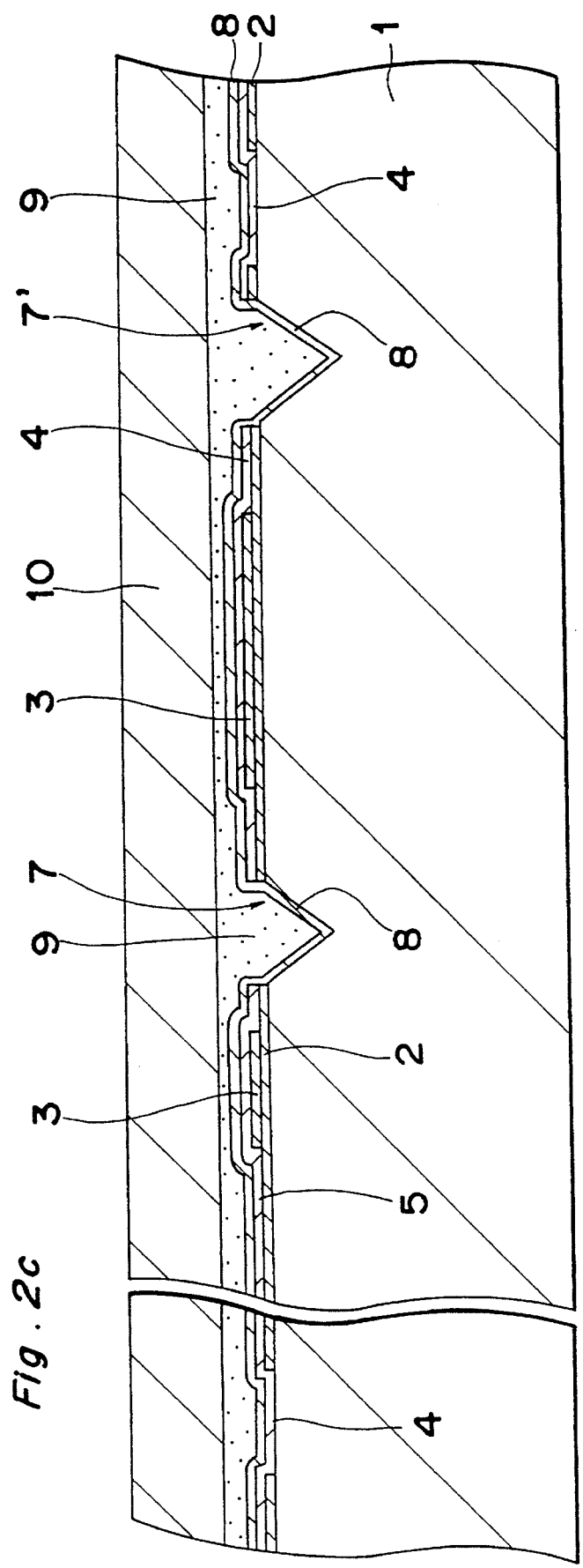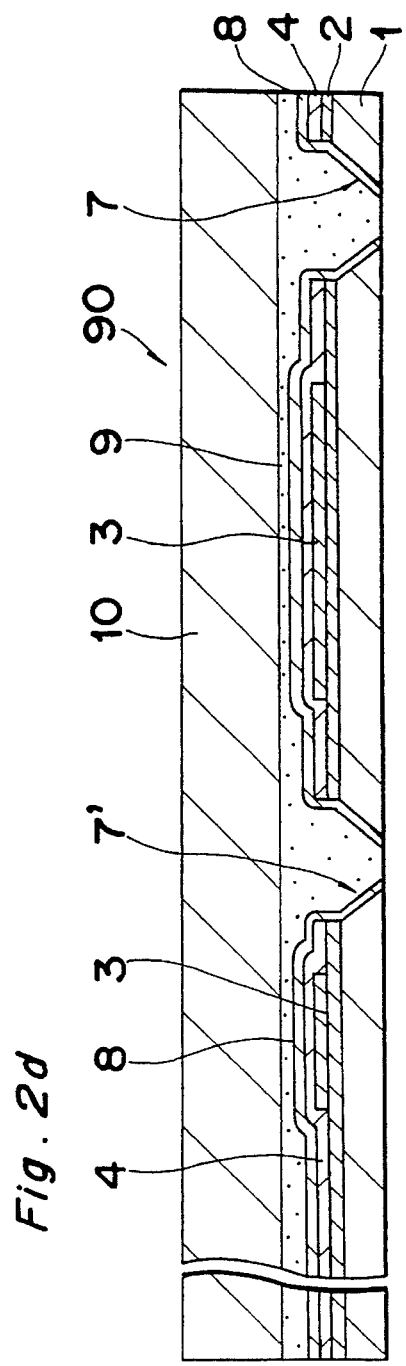

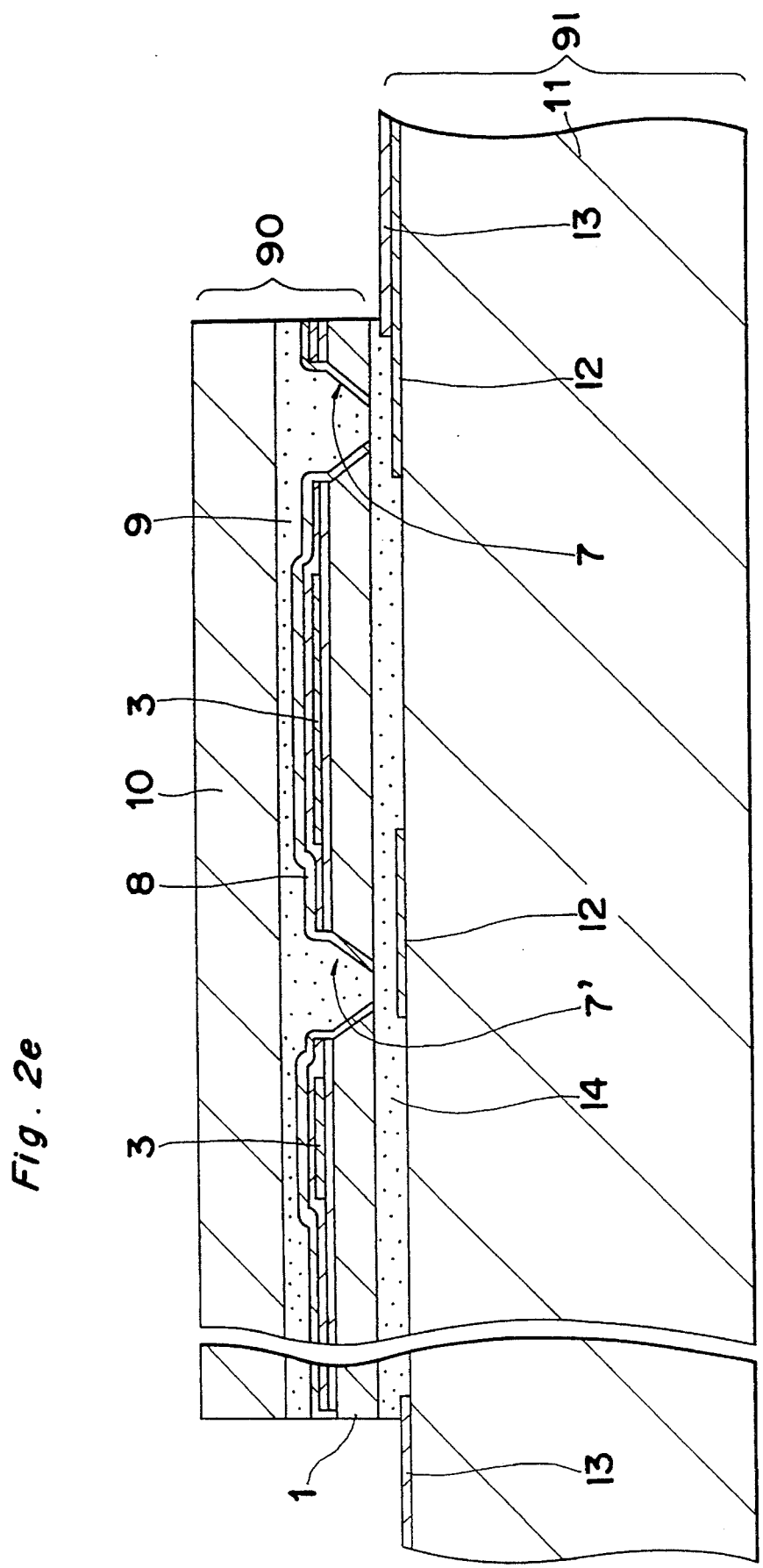

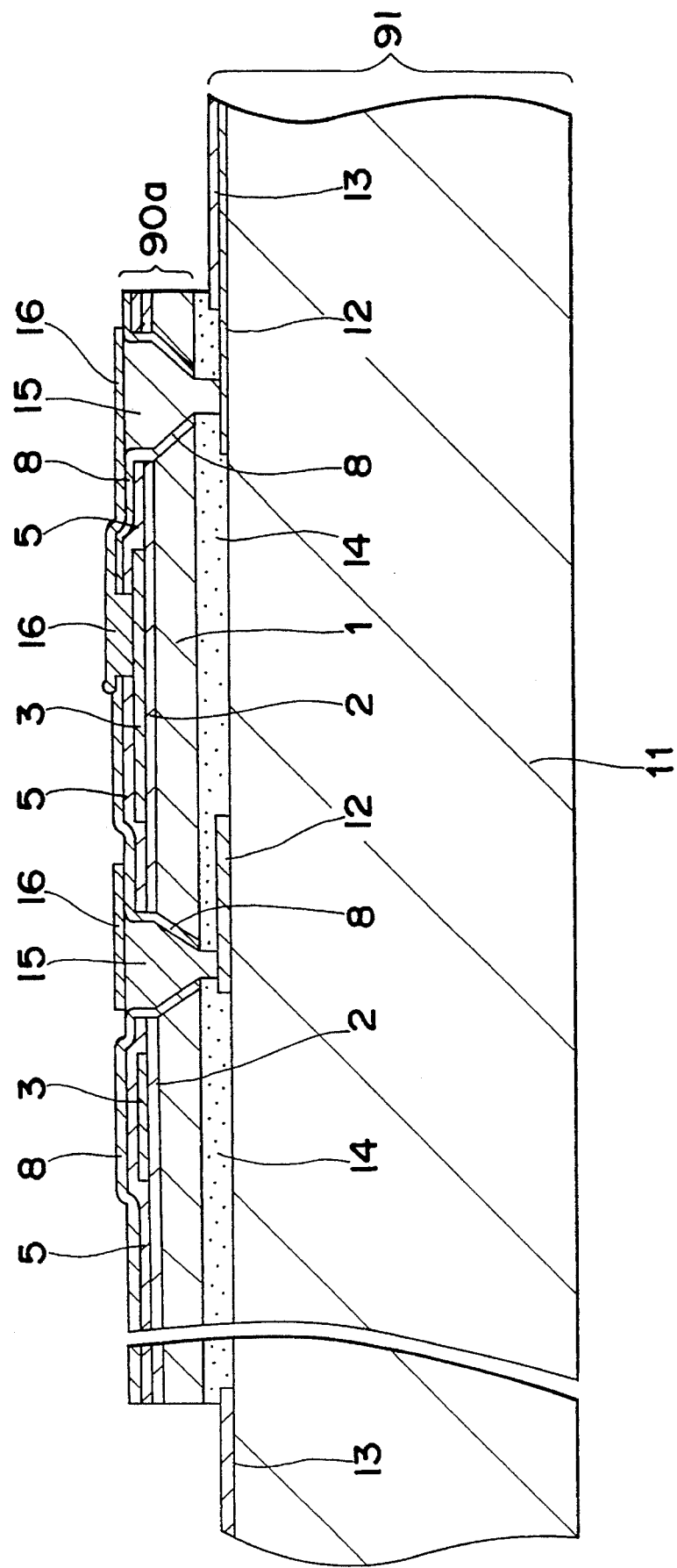

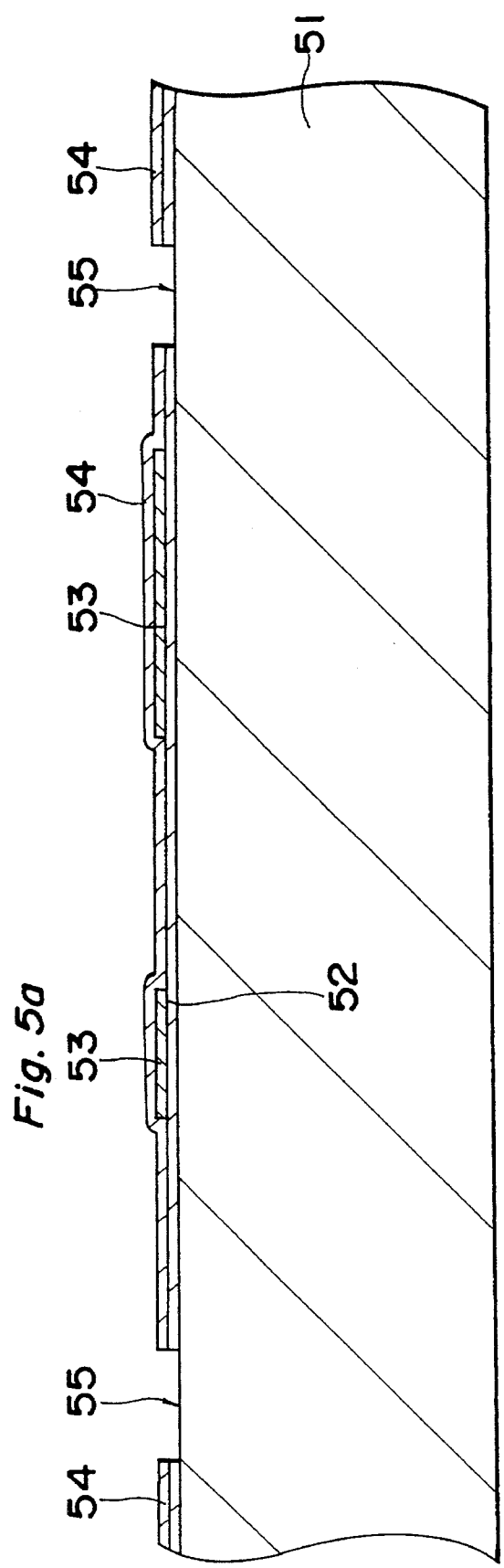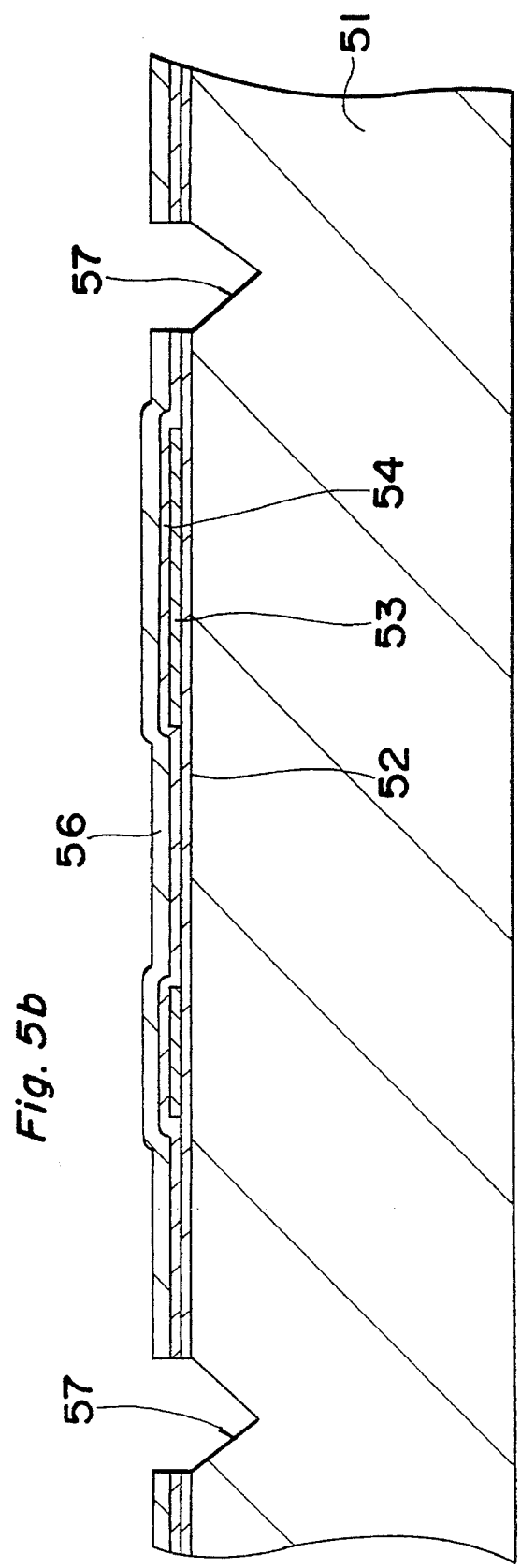

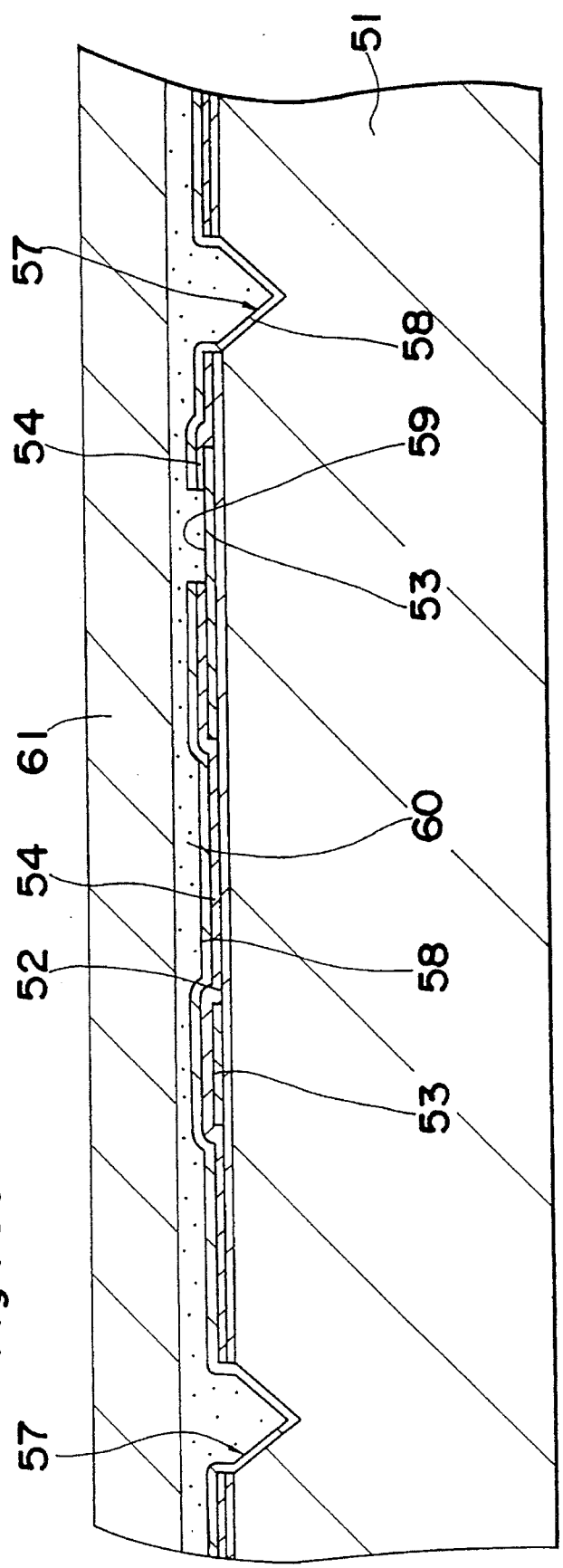

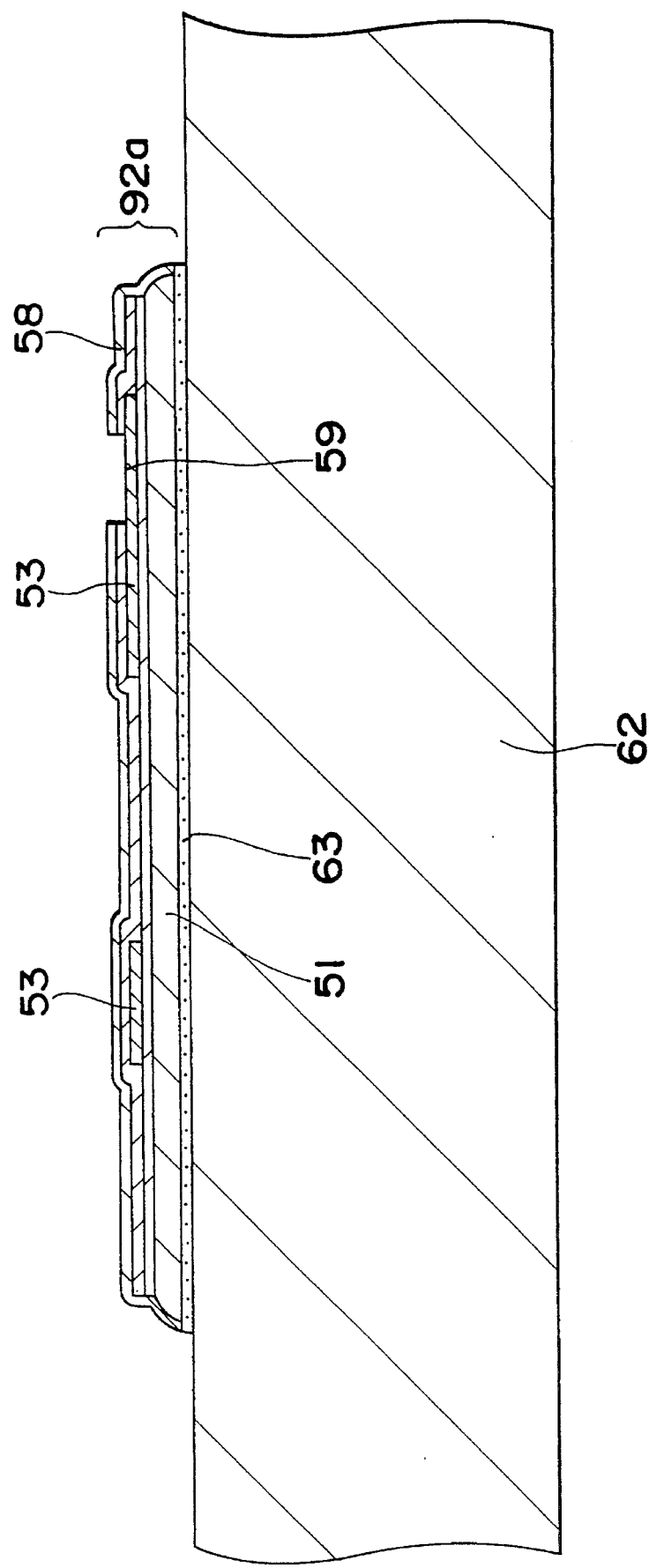

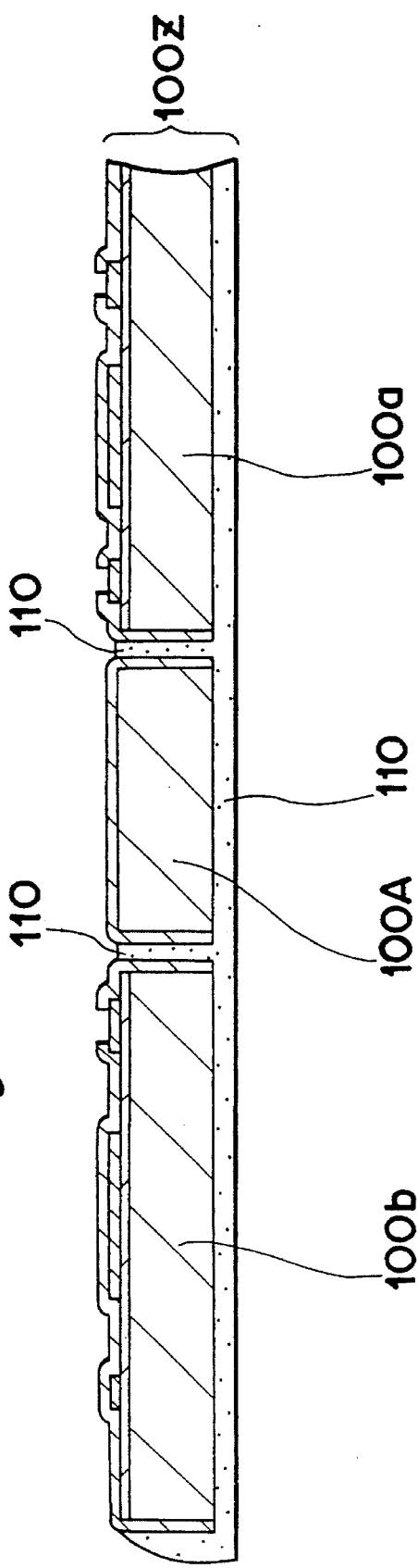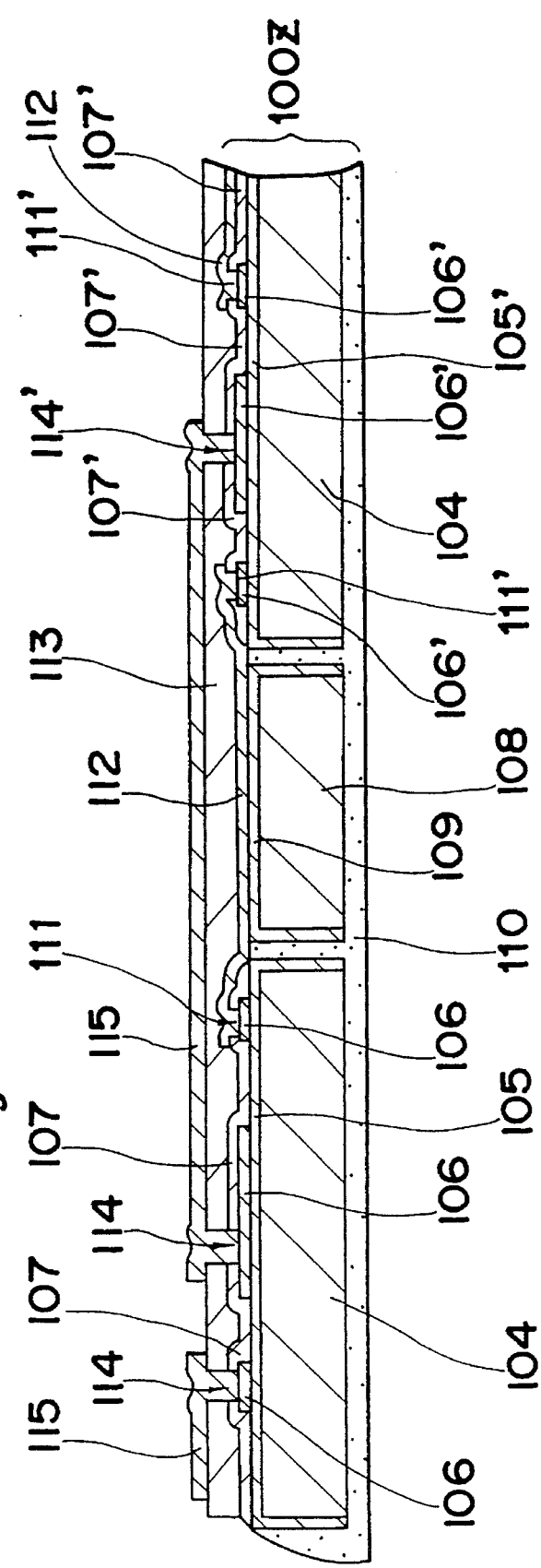

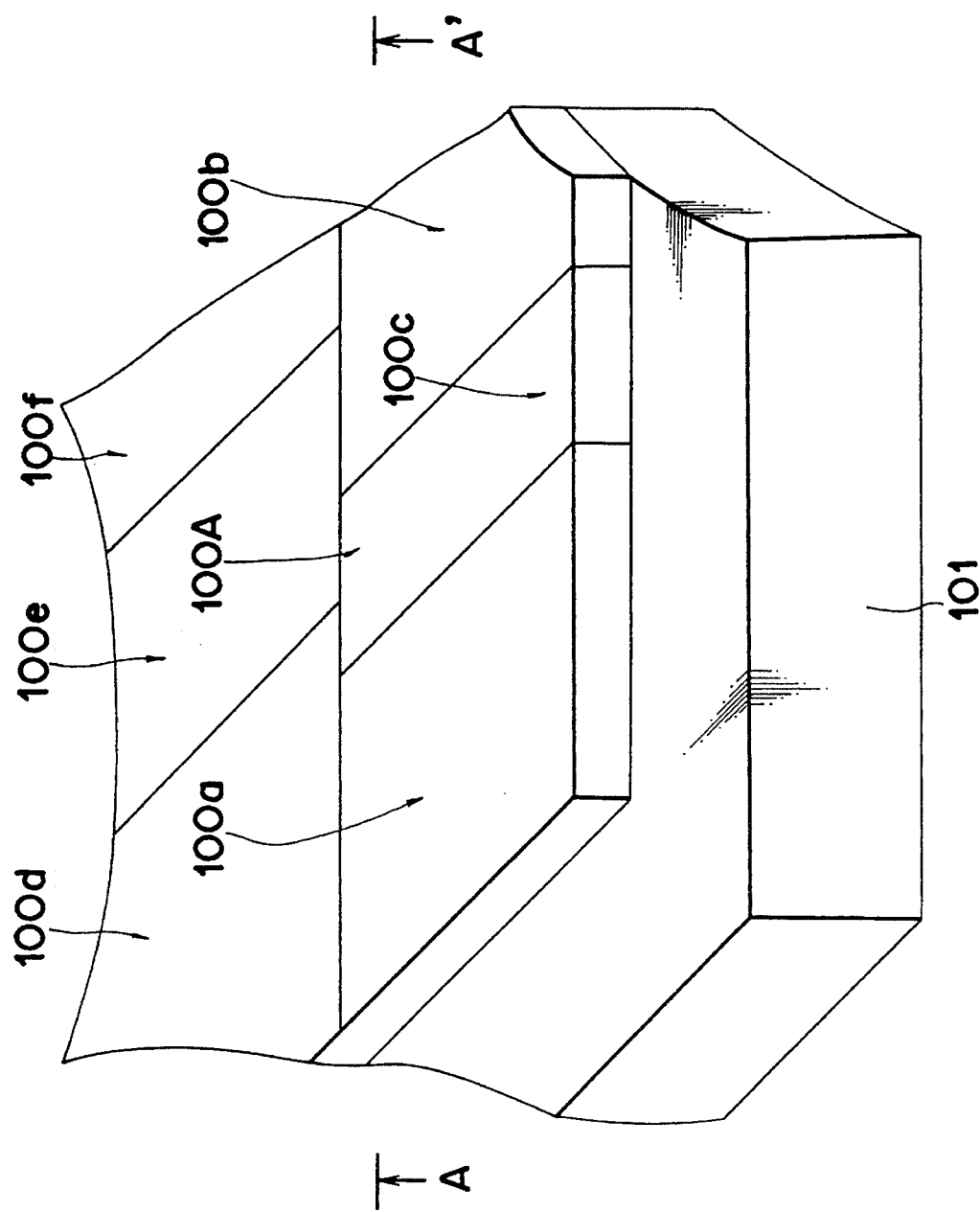

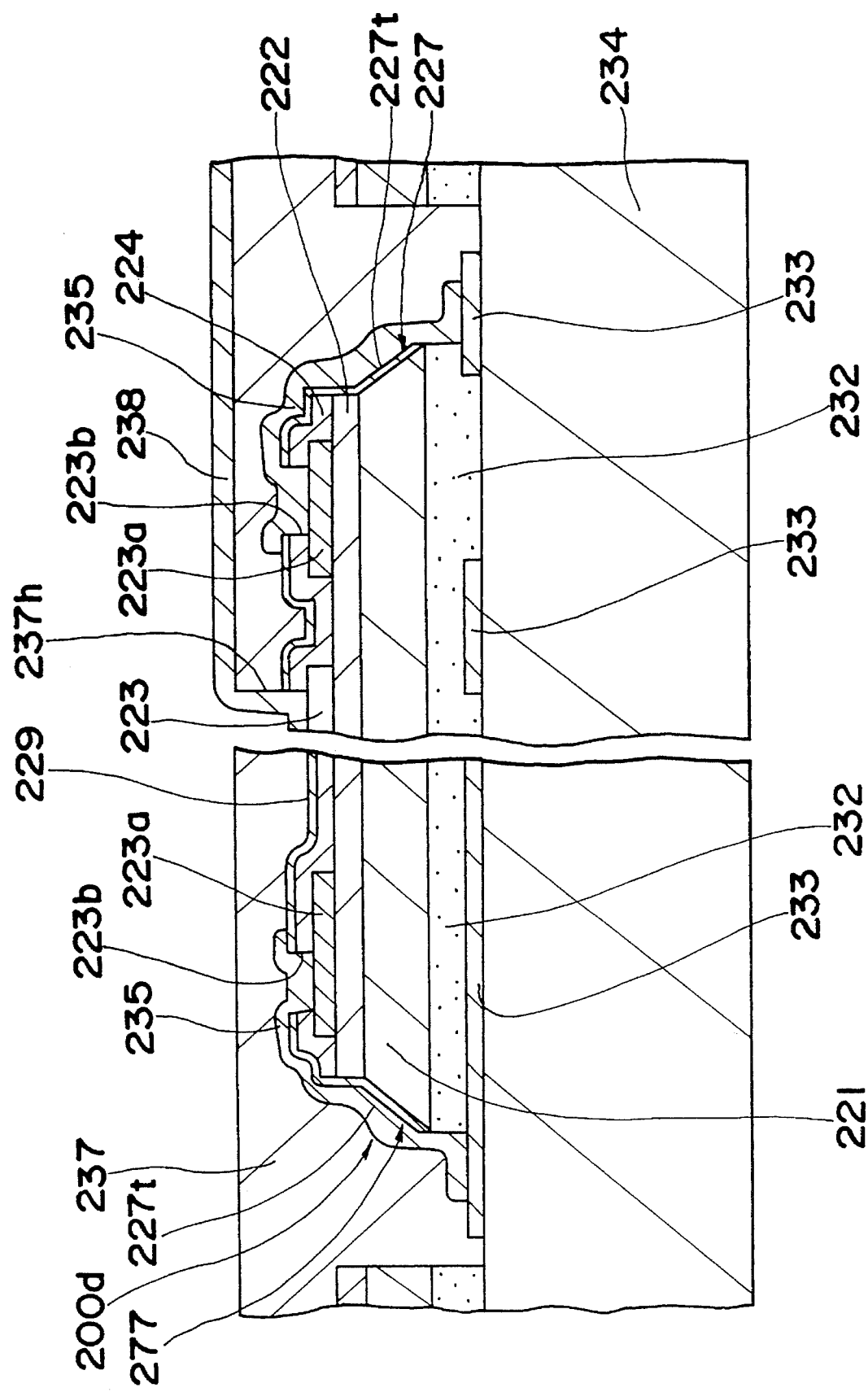

LARGE SCALE HIGH DENSITY SEMICONDUCTOR APPARATUS

This application is a continuation of application Ser. No. 07/933,582 filed on Aug. 24, 1992, now abandoned; which was a continuation of application Ser. No. 07/456,865 filed on Dec. 27, 1989, now abandoned.

BACKGROUND OF THE INVENTION

1. Field of the Invention

The present invention relates to a semiconductor apparatus such as a large scale integrated circuit (referred to as an LSI hereinafter), and more particularly, to a semiconductor apparatus including semiconductor devices fabricated on a wafer in a high density and in a large scale integration.

2. Description of Related Art

Recently, there have been great demands for miniaturizing electronic apparatuses such as office automation equipment, audio and/or visual equipment, for various kinds of functions thereof, and for reducing the cost thereof. Accompanying with this, it has been necessary to fabricate semiconductor apparatuses in a high density and in a large scale integration, which are used in these electronic apparatuses.

In order to satisfy these demands, the Wafer Scale Integration method (referred to as a WSI method hereinafter) has been studied, to which the concept of the conventional LSI was extended. In a semiconductor apparatus fabricated by the WSI method, multiple chips are fabricated on one wafer in a large scale integration, wherein the multiple chips having various kinds of functions are electrically connected to each other through interconnection films.

Since the interconnection films thereof are formed on the wafer in a similar manner to fabricating conventional LSIs such as the wafer process technique, the semiconductor apparatuses fabricated by the WSI method have the following advantages, as compared with a conventional semiconductor apparatus wherein a plurality of electronic circuit components such as conventional LSI packages are formed on a printed circuit substrate.

(a) Devices and interconnection films for connecting the devices can be arranged in a high density.

(b) Signals having higher frequencies can be handled therein, a high signal to noise ratio can be obtained, and power consumption can be lowered, because the length of each interconnection film can be shortened.

(c) There is a possibility of lowering the cost of the semiconductor apparatus since the multiple chips having various kinds of functions can be fabricated on one wafer utilizing the wafer process technique.

However, because the semiconductor apparatus fabricated by the WSI method has a much larger area than that of the conventional LSI of one chip, the whole wafer is dealt as defective in the case that there is at least one defective on the wafer. Therefore, there is such a problem that the yield thereof becomes very low. Furthermore, in the semiconductor apparatus fabricated by the WSI method, since the devices and the interconnection films for connecting the devices are monolithically formed on the wafer utilizing a fabrication process performed for every wafer, there are such disadvantages that it is difficult to mixedly form various kinds of devices on one wafer, and also the number of the fabrication processes increases. Due to this, the devices to be formed on the same wafer are limited to particular devices, and also the range of the applications of the WSI method becomes very narrow.

In order to solve the aforementioned problems, a fabrication method for a multichip substrate system has been proposed. A multichip substrate system is fabricated as follows.

First of all, various kinds of wafers on which devices such as LSIs are formed are diced so as to be divided into a plurality of chips, and nondefective chips are picked up among the plurality of diced chips. Thereafter, only the nondefective chips are fabricated as components on an electrically insulating substrate. Then, there can be obtained a multichip substrate system having a scale larger than that of the system formed on each chip.

FIG. 1 is a cross-sectional view showing a conventional semiconductor apparatus fabricated by the aforementioned fabrication method for the multichip substrate system.

Both semiconductor chips 200i and 200k with integrated circuit components formed on the top surface thereof are coated with an electrically insulating film 271, and the semiconductor chips 200i and 200k are bonded on predetermined positions of an electrically insulating substrate 273 through an adhesive layer 274 so as to be apart from each other by a predetermined distance. A mediation chip 200j without any circuit components is bonded at a position between the semiconductor chips 200i and 200k on the insulating substrate 273 through the adhesive layer 274, in order to keep the top surface thereof flat, wherein the mediation chip 200j is coated with the insulating film 271. Similarly, various kinds of chips are bonded on the insulating substrate 273 through the adhesive layer 274.

Respective interconnection films 280 formed on the semiconductor chips 200i and 200k are electrically connected to each other through an interconnection film 275, which is coated with an electrically insulating film 276. The interconnection film 275 is electrically connected to an interconnection film 277a and a connection pad 277b, which are formed on the insulating film 276, through a hole 276a formed at a predetermined position of the insulating film 276. The connection pad 277b is electrically connected to an interconnection film 278 formed on the insulating substrate 273 through a lead wire 279.

However, there are the following problems in the semiconductor apparatuses fabricated by the aforementioned conventional fabrication methods.

In the multichip substrate system, because it is necessary to electrically connect multiple interconnection films formed on the substrate to external terminals formed on another substrate or the main body of the semiconductor apparatus through the connection pads formed on the outer edge portions of the substrate, there is such a problem that the number of the connection pads increases steeply. Furthermore, in the multichip substrate system, the area of the substrate on which the devices and the interconnection films are formed becomes remarkably larger than that of the conventional LSI chip. On the other hand, the area of the outer edge portions where the connection pads are to be formed is relatively small. Therefore, the problem of the increase of the connection pads which accompanies the aforementioned large scale integration becomes extremely serious.

Further, in conventional connection methods such as the wire bonding method and the tape carrier method, which have been widely used as a method of connecting the external terminals and the connection pads formed on the substrate, it is necessary to form each pad having a relatively large area in the range from about 80 μm square to about 100 μm square in order to keep a predetermined connection strength between each pad and connector such as a lead wire. Furthermore, taking into consideration a shift of the connection point of each lead wire from a predetermined connection point on each connection pad upon a connection process of bonding each lead wire, it is necessary to provide a gap between the adjacent pads larger than several tens of μm. Due to this, there are such problems that the enhancement of the integration makes the ratio of the area where the pads are formed to that of the substrate extremely large, and also the manufacturing cost thereof remarkably increases.

Because the pads are formed on the outer edge portions of the substrate, the pattern of the interconnection films for electrically connecting interconnection terminals formed on each chip to respective pads becomes complicated. Therefore, it becomes difficult to design the semiconductor apparatus optimally, and respective costs of the design and the fabrication process remarkably increases. Because respective chips are arranged in a two-dimensional array on the substrate, this sets a limit to arrange respective chips in a higher density and to miniaturize them, and also leads to the increase in the length of each of the interconnection films for electrically connecting a chip to the pads and the interconnection film for electrically connecting respective chips. Therefore, the increase in the length thereof causes the following problems: the devices and the interconnection films cannot be arranged in a high density, a high signal to noise ratio cannot be obtained, and power consumption cannot be lowered.

SUMMARY OF THE INVENTION

An essential object of the present invention is to provide a semiconductor apparatus comprising integrated circuits arranged in a high density and in a large scale integration, which is capable of being fabricated in a smaller number of fabrication processes.

Another object of the present invention is to provide a semiconductor apparatus comprising integrated circuits arranged in a high density and in a large scale integration, where a pattern of each interconnection film of which can be designed easily.

A further object of the present invention is to provide a semiconductor apparatus comprising integrated circuits arranged in a high density and in a large scale integration, which is capable of obtaining a higher yield thereof.

A still further object of the present invention is to provide a semiconductor apparatus comprising integrated circuits arranged in a high density and in a large scale integration, which is capable of easily forming thereon a combination of various kinds of circuit components fabricated by a different fabrication process.

A still more further object of the present invention is to provide a semiconductor apparatus comprising integrated circuits arranged in a high density and in a large scale integration, which is capable of shortening the length of each interconnection film to be formed thereon.

In order to accomplish the aforementioned objects, according to one aspect of the present invention, there is provided a semiconductor apparatus comprising:

an electrically insulating circuit substrate on which electrically conductive interconnection films are separately formed;

at least one semiconductor chip having electrodes, the semiconductor chip being bonded on the circuit substrate;

at least two through holes being formed in the semiconductor chip so as to pierce the semiconductor chip in the direction of the thickness thereof; and electrically conductive bodies being formed in the through holes, respectively, each of the conductive bodies electrically connecting a predetermined electrode of the semiconductor chip to a predetermined interconnection film formed on the circuit substrate.

According to another aspect of the present invention, there is provided a semiconductor apparatus comprising:

an electrically insulating circuit substrate on which electrically conductive interconnection films are separately formed;

at least one semiconductor chip having electrodes, the semiconductor chip being bonded on the circuit substrate; and at least two electrically conductive films being separately formed on a side surface of the semiconductor chip, each of the conductive films electrically connecting a predetermined electrode of the semiconductor chip to a predetermined interconnection film formed on the circuit substrate.

According to a further aspect of the present invention, there is provided a semiconductor apparatus comprising:

an electrically insulating circuit substrate on which electrically conductive interconnection films are separately formed;

a plurality of semiconductor chips being bonded so as to be stacked on the circuit substrate, each of the plurality of semiconductor chips having electrodes; and electrical connection means, each of the connection means electrically connecting a predetermined electrode of each of the semiconductor chips to a predetermined interconnection film formed on the circuit substrate.

According to a still further aspect of the present invention, there is provided a semiconductor apparatus comprising:

a plurality of semiconductor chips including circuit components having electrodes, the semiconductor chips being bonded onto each other so as to form an assembled chip; and electrically conductive interconnection films being separately formed on the plurality of semiconductor chips, each of the interconnection films electrically connecting respective predetermined electrodes of the plurality of semiconductor chips of the assembled chip to each other.

BRIEF DESCRIPTION OF THE DRAWINGS

These and other objects and features of the present invention will become clear from the following description taken in conjunction with the preferred embodiments thereof with reference to the accompanying drawings, in which:

FIG. 2a to 2g are cross-sectional views showing a fabrication process of a semiconductor apparatus of a first preferred embodiment according to the present invention;

FIGS. 5a to 5f are cross-sectional views showing a fabrication process of a semiconductor apparatus of a fourth preferred embodiment according to the present invention;

FIGS. 8a to 8d are cross-sectional views showing a fabrication process of a semiconductor apparatus of a sixth preferred embodiment according to the present invention, wherein FIG. 8a is the cross-sectional view taken on a line A—A' of FIG. 9;

FIG. 9 is a schematic perspective view showing the semiconductor apparatus shown in FIG. 8a;

FIG. 14 is a cross-sectional view showing a semiconductor apparatus of a ninth preferred embodiment according to the present invention;

FIG. 15b is a cross-sectional view taken on a line B—B' of FIG. 15a;

FIG. 16b is a cross-sectional view taken on a line C—C' of FIG. 16a;

FIG. 17b is a cross-sectional view taken on a line D—D' of FIG. 17a;

DETAILED DESCRIPTION OF THE PREFERRED EMBODIMENTS

Preferred embodiments according to the present invention will be described below with reference to the attached drawings.

First Preferred Embodiment

Figure 1:
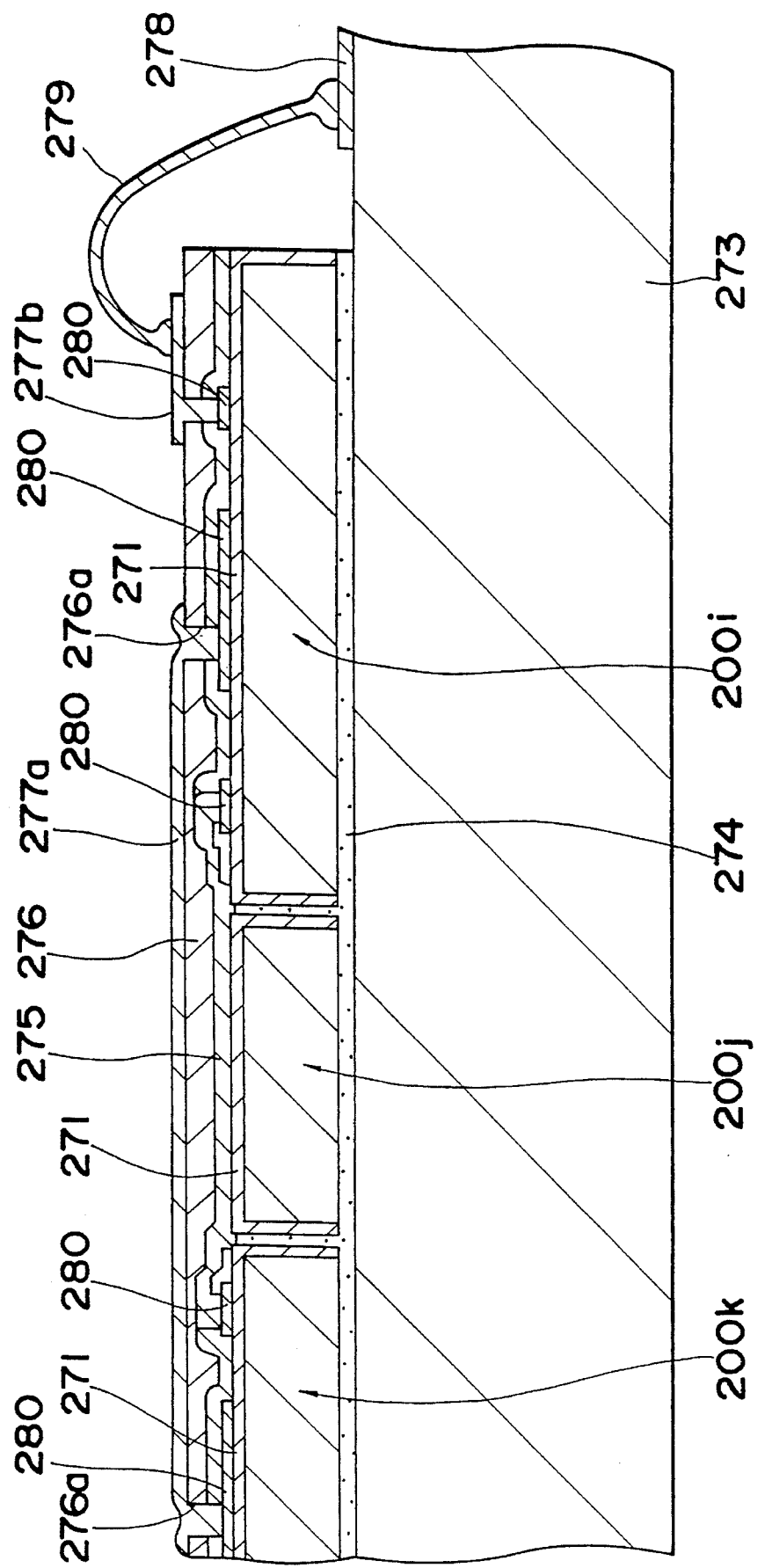
FIG. 1 is a cross-sectional view showing a conventional semiconductor apparatus fabricated by a fabrication method of the multichip substrate system.
Figure 2A:
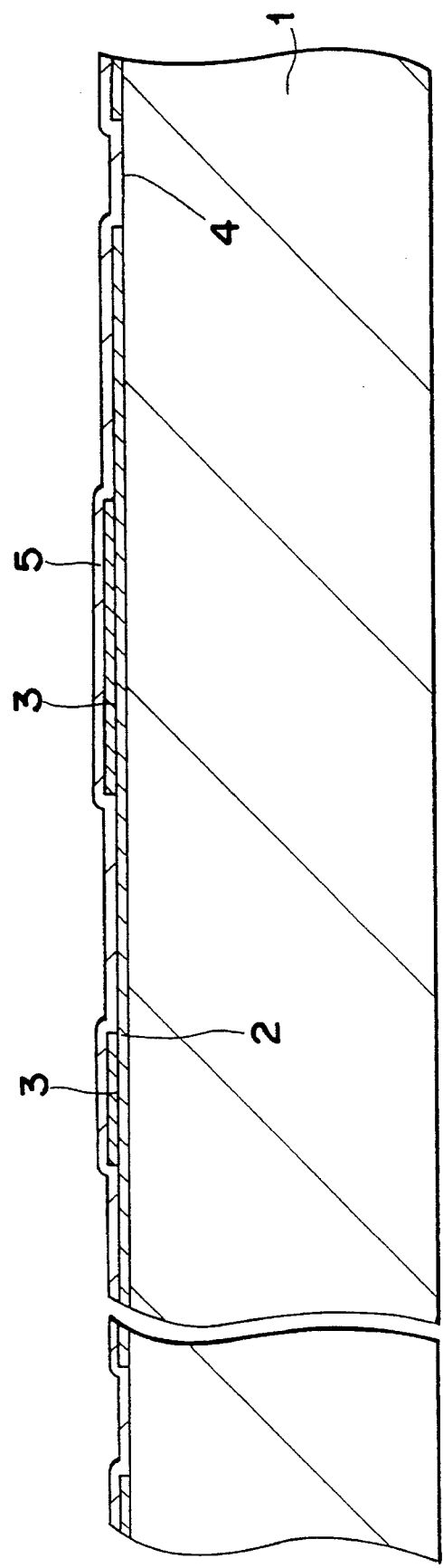

FIG. 2g is a cross-sectional view showing a semiconductor apparatus of a first preferred embodiment according to the present invention, and FIGS. 2a to 2f are cross-sectional views showing a fabrication process of the semiconductor apparatus shown in FIG. 2g.

Referring to FIG. 2a, on a top surface of a silicon wafer 1 of silicon single crystal having a surface orientation of (100), there are formed an electrically insulating film 2 of an electrically insulating material such as $SiO_2$, or SiN, an electrode film 3, a chip boundary 4, and an electrically insulating protection film 5 of an electrically insulating material such as $SiO_2$, or SiN for protecting the top surface thereof. To form various kinds of circuit devices such as MOSFETs thereon, the insulating film 2 is used in a manner similar to that of fabricating a conventional integrated circuit well known to those skilled in the art.

In the fabrication process thereof, first of all, the insulating film 2 is formed on the top surface of the silicon wafer 1 by the thermal oxidation method or the chemical vapor deposition method. The vapor deposition method is referred to as the CVD method hereinafter. After a metal film of a metal such as Al, Mo, W, or WSi is formed on substantially the whole top surface of the silicon wafer 1 by either the electron beam vapor deposition method, the sputtering method, or the CVD method, the metal film is etched by either the photoetching method or the selection etching method so as to have a predetermined pattern, which results in the electrode film 3.

The chip boundary 4 is a portion to be diced upon cutting the silicon wafer 1, on which the circuit devices are formed, into semiconductor chips. On the chip boundary 4, the insulating film 2 is removed by either the photoetching method or the selection etching method. The insulating film 5 is formed thereon by either the low temperature CVD method or the plasma CVD method.

Figure 2B:
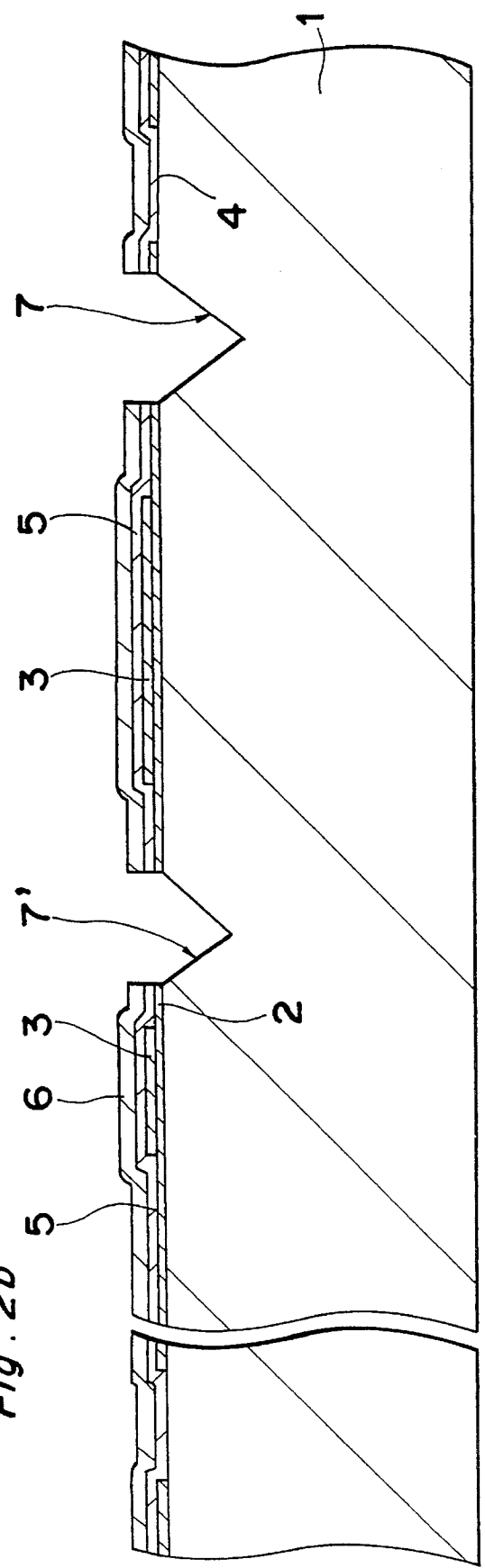

Thereafter, as shown in FIG. 2b, metal films of a metal such as TiAu, or CrAu are formed sequentially so as to be stacked on substantially the whole surface of the silicon wafer 1, which results in a multilayer film. Then, the multilayer film is etched by either the photoetching method or the selection etching method so as to have a predetermined pattern, which results in a multilayer metal film 6. Thereafter, the insulating film 5 and the insulating film 2 are etched sequentially using the multilayer metal film 6 as a mask, and then, the exposed top surface of the silicon wafer 1 is etched by the anisotropy etching method using an alkaline etching liquid such as KOH or NaOH so as to form holes 7 and 7' therein. At that time, because there is used the silicon wafer 1 having a surface orientation of (100), the top surface of the silicon wafer 1 is etched in parallel to the plane (111) using the alkaline etching liquid, so as to form the V-shaped holes 7 and 7' therein, wherein the depth of each of the holes 7 and 7' is determined depending on the pattern configuration located in the vicinity of the exposed top surface of the silicon wafer 1.

It is to be noted that the holes 7 and 7' may be formed by the isotropy etching method using an acid etching liquid such as HF, or $HNO_3$.

Thereafter, each metal film of the multilayer metal film 6 is etched sequentially using either aqua regia or concentrated sulfuric acid so as to completely remove the multilayer metal film 6, and then, an electrically insulating film 8 of an electrically insulating material such as $SiO_2$, or SiN formed thereon by either the low temperature CVD method or the plasma CVD method so as to coat the top surface of the silicon wafer 1 and the internal surfaces of the holes 7 and 7' therewith, as shown in FIG. 2c. Thereafter, a protection substrate 10 of a material such as glass, or acrylic resin is bonded thereon through an adhesive layer 9 of wax.

Thereafter, the silicon wafer 1 is shaped into a thin plate configuration having a predetermined thickness by processing the bottom surface of the silicon wafer 1 by a physical method such as a lapping method, or a polishing method, so as to expose the holes 7 and 7' to the bottom surface thereof. Alternatively, there may be used a chemical method using an alkaline etching liquid such as KOH or NaOH. Thereafter, the silicon wafer 1 is diced on the chip boundary 4 so as to be divided into respective semiconductor chips 90, as shown in FIG. 2d.

On the other hand, as shown in FIG. 2e, on an electrically insulating substrate 11 of an electrically insulating material such as ceramic, beryllia porcelain, or glass, there are sequentially formed an interconnection film 12 having a pattern of either a thin film of a metal material such as TiAu, CrAu, or a thick film of Au paste, and a protection film 13 of an electrically insulating material such as $SiO_2$ for coating predetermined portions of the interconnection film 12, which results in a printed circuit substrate 91.

Thereafter, the bottom surface of the semiconductor chip 90 and/or the top surface of the printed circuit substrate 91 are coated with an adhesive of epoxy resin, or polyimide. Then, the semiconductor chip 90 is bonded through an adhesive layer 14 on a predetermined position of the printed circuit substrate 91 under the conditions of a predetermined pressure and a predetermined temperature.

Figure 2F:
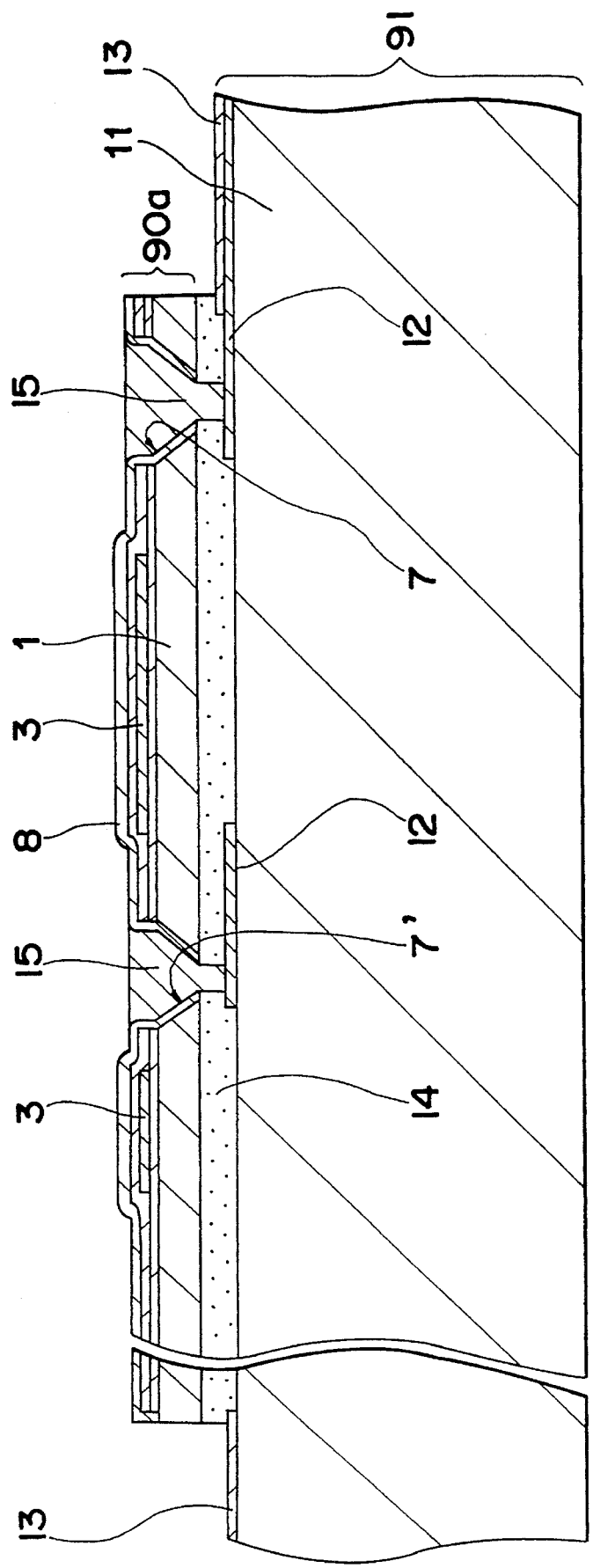

Thereafter, the adhesive layer 9 is melted at a predetermined temperature, and then, the protection substrate 10 is removed so as to be separated from the chip 90, which results in a chip 90a formed on the printed circuit substrate 91 as shown in FIG. 2f. Thereafter, the adhesive layer 14 located under the holes 7 and 7' is removed by either a chemical method using sulfuric acid or a physical method such as the plasma etching method, so as to expose the interconnection film 12 located under the holes 7 and 7'. Thereafter, a metal body 15 of a metal such as Ni is stuffed in the holes 7 and 7' by the electroless plating method and/or the electro plating method, as shown in FIG. 2f.

Thereafter, as shown in FIG. 2g, respective partial portions of the insulating film 8 and the insulating film 5 are removed sequentially by either the photoetching method or the selection etching method so as to leave the insulating film 8 having a predetermined pattern and the insulating film 5 having a predetermined pattern, in order to form exposed windows of partial portions of the interconnection film 3. Then, after the whole top surface of the chip 90a is coated with an electrically conductive film of an electrically conductive material such as Al, Mo, W, or Wsi by either the electron beam vapor deposition method, the sputtering method, or the CVD method, the electrically conductive film is etched by either the photoetching method, the selection etching method, or the electroless plating method so as to form an interconnection film 16 having a predetermined pattern, which results in the desirable semiconductor apparatus of the first preferred embodiment shown in FIG. 2g.

Second Preferred Embodiment

Figure 3:
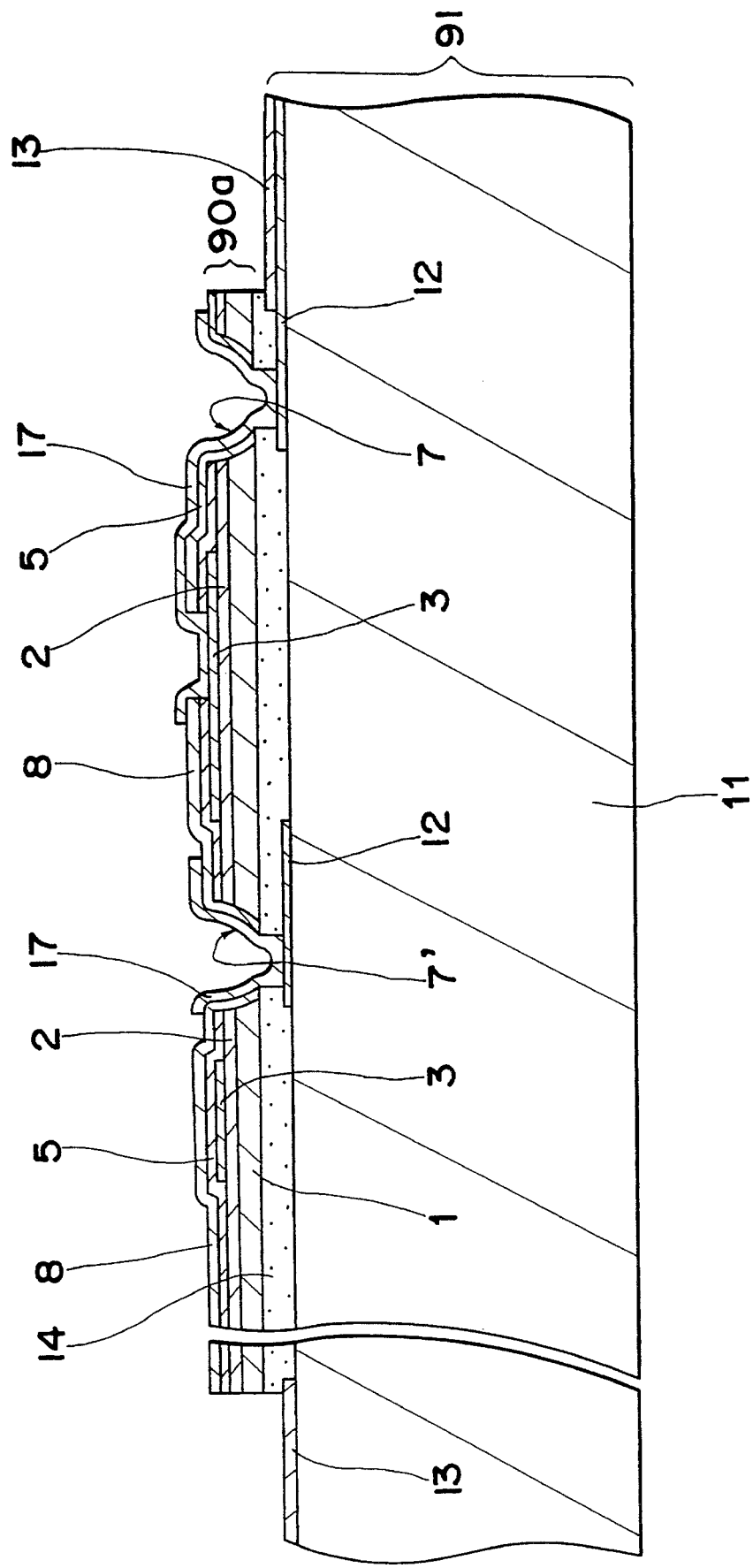
FIG. 3 is a cross-sectional view showing a semiconductor apparatus of a second preferred embodiment according to the present invention.

FIG. 3 is a cross-sectional view showing a semiconductor apparatus of a second preferred embodiment according to the present invention. In FIG. 3, the components similar to that shown in FIGS. 2a to 2g are denoted by the same numerical references shown in FIGS. 2a to 2g. The semiconductor apparatus of the second preferred embodiment is characterized by a direct connection between the interconnection film 12 formed on the printed circuit substrate 91 and the interconnection film 3 formed on the chip 90a through a thin metal film 17 formed on internal surfaces of the through holes 7 and 7'.

A process of fabricating the semiconductor apparatus of the second preferred embodiment will be described below.

First of all, each fabrication process described referring to FIGS. 2a to 2e is performed in the manner similar to that of the first preferred embodiment.

Thereafter, the adhesive layer 9 shown in FIG. 2e is melted at a predetermined temperature, and then, the protection substrate 10 is removed so as to be separated from the chip 90. After partial portions of the adhesive layer 14 located under the holes 7 and 7' are removed so as to expose the interconnection film 12 located under the holes 7 and 7' respective predetermined partial portions of the insulating film 8 and the insulating film 5 are removed sequentially by either the photoetching method or the selection etching method as shown in FIG. 3 so as to leave the insulating film 8 having a predetermined pattern and the insulating film 5 having a predetermined pattern, in order to form exposed windows of predetermined partial portions of the interconnection film 3.

Then, after the whole top surface of the chip 90a is coated with an electrically conductive film of an electrically conductive material such as Al, Mo, W, or WSi by either the electron beam vapor deposition method, the sputtering method, or the CVD method, the electrically conductive film is etched by either the photoetching method, the selection etching method, or the electroless plating method so as to form an interconnection film 17 having a predetermined pattern for directly connecting the interconnection film 12 formed on the printed circuit substrate 91 to the interconnection film 3 formed on the chip 90a, which results in the desirable semiconductor apparatus of the second preferred embodiment according to the present invention shown in FIG. 3.

In the semiconductor apparatus of the second preferred embodiment, because the silicon wafer 1 has a relatively small thickness, there is not caused any disconnection of the interconnection film 17 due to steps of the through holes 7 and 7'. Thus, the semiconductor apparatus thereof has such advantages that the fabrication process of the semiconductor apparatus is simpler than the conventional fabrication process, and the cost thereof is lowered.

Third Preferred Embodiment

Figure 4:
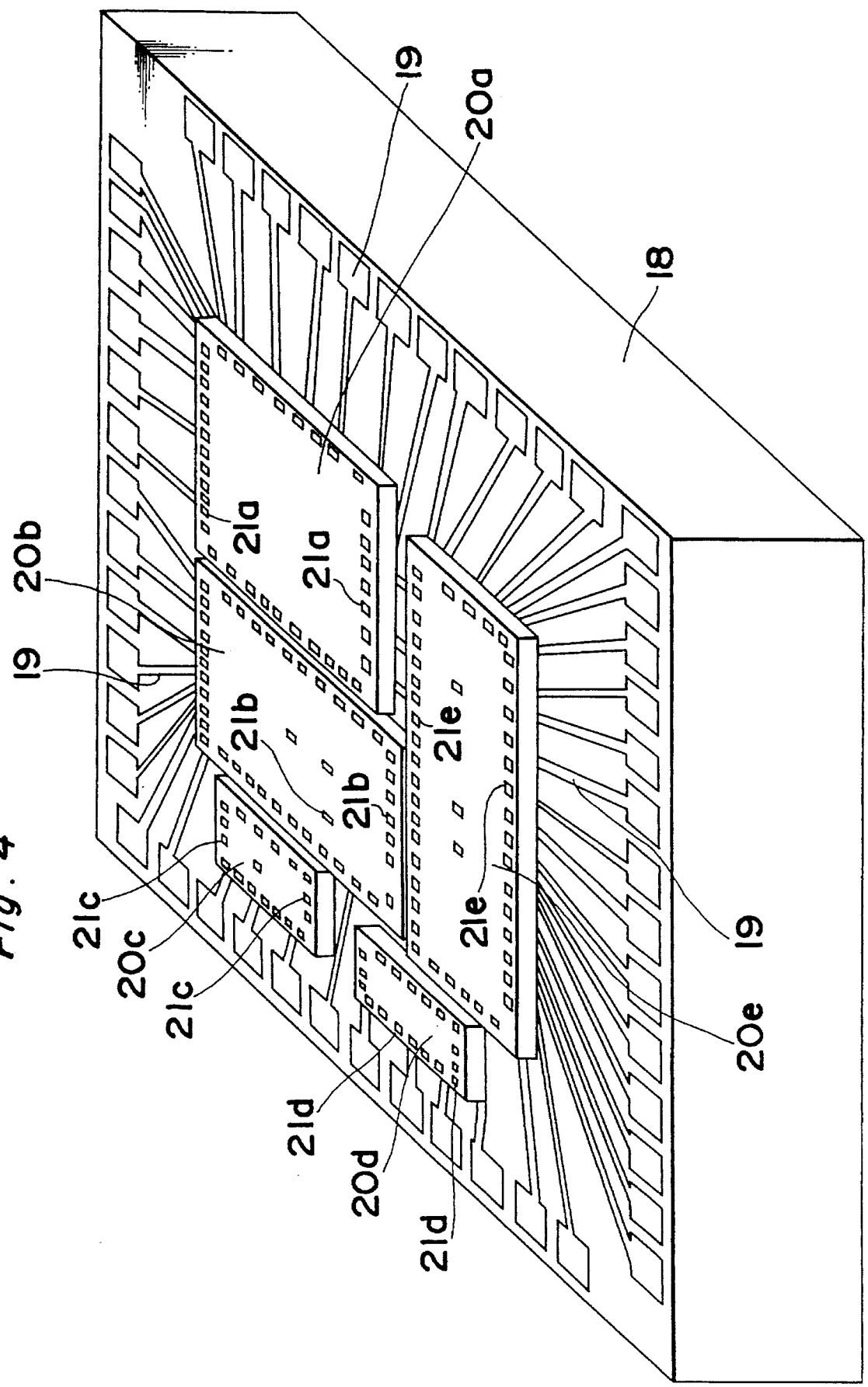
FIG. 4 is a schematic perspective view showing a semiconductor apparatus of a third preferred embodiment according to the present invention.

FIG. 4 shows a semiconductor apparatus of a third preferred embodiment according to the present invention. The semiconductor apparatus of the third preferred embodiment is characterized in that a plurality of semiconductor chips 20a to 20e are bonded on a printed circuit substrate 18 in a density higher than the density for conventional semiconductor apparatuses.

Referring to FIG. 4, the plurality of semiconductor chips 20a to 20e are bonded on the printed circuit substrate 18 of an electrically insulating material such as ceramic, beryllia porcelain, or glass, and electrically conductive interconnection films (not shown) formed on the chips 20a to 20e are connected to electrically conductive films 19 formed on the substrate 18 through electrically conductive interconnection films 21a to 21e formed on internal surfaces of through holes (not shown) of the chips 20a to 20e.

The semiconductor apparatus of the third preferred embodiment is fabricated in the manner similar to that of the first and second preferred embodiments.

In the semiconductor apparatus of the third preferred embodiment, respective semiconductor chips 20a to 20e can be arranged more closely on the printed circuit substrate 18. Namely, because the distance between respective adjacent semiconductor chips 20a to 20e is decreased, the length of each interconnection film for electrically connecting respective semiconductor chips 20a to 20e to each other can be shortened, which does not result in a problem of delay of signals transmitted therebetween. Further, the system design thereof becomes simpler than that of conventional semiconductor apparatuses. Since many semiconductor chips 20a to 20e can be processed simultaneously after bonding them on the printed circuit substrate 18, the number of the fabrication processes per one semiconductor chip can be decreased, and the fabrication cost thereof can be lowered.

Fourth Preferred Embodiment

Figure 5F:
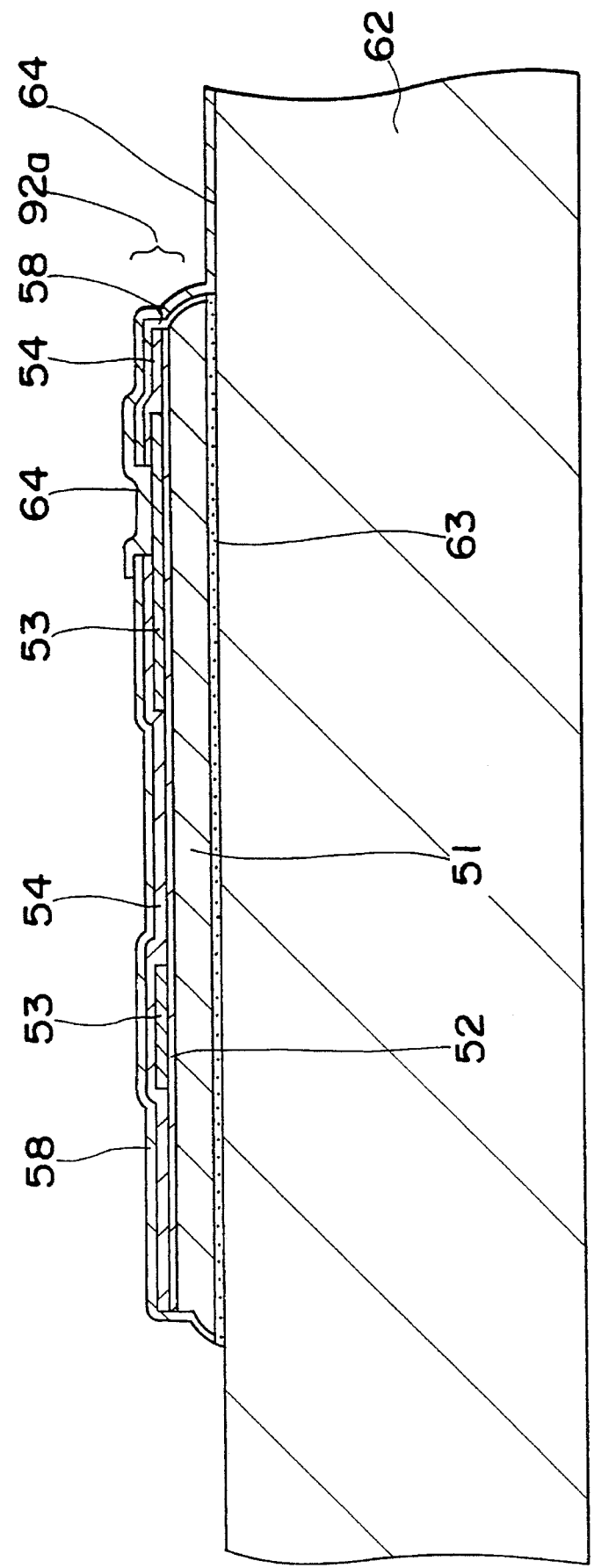

FIG. 5f is a cross-sectional view showing a semiconductor apparatus of a fourth preferred embodiment according to the present invention, and FIGS. 5a to 5e are cross-sectional views showing a fabrication process of the semiconductor apparatus thereof. The semiconductor apparatus thereof is characterized in that an electrode film 53 formed on a semiconductor chip 92a such as an integrated circuit chip is led into the top surface of an electrically insulating substrate 62 by an electrically conductive film 64, as shown in FIG. 5f.

Referring to FIG. 5a, on a top surface of a silicon waver 51 of silicon single crystal having a surface orientation of (100), there are formed an electrically insulating film 52 of an electrically insulating material such as SiO$_2$, or SiN for protecting the top surface thereof, and a chip boundary 55. To form various kinds of circuit devices such as MOSFETs thereon the insulating film 52 is used in a manner similar to that of fabricating a conventional integrated circuit well known to those skilled in the art.

In the fabrication process thereof, first of all, the insulating film 52 is formed on the top surface of the silicon wafer 51 by the thermal oxidation method or the CVD method. After a metal film of a metal such as Al, Mo, W, or WSi is formed on substantially the whole top surface of the silicon wafer 51 by either the electron beam vapor deposition method, the sputtering method, or the CVD method, the metal film is etched by either the photoetching method or the selection etching method so as to have a predetermined pattern, which results in the electrode film 53.

The insulating film 54 is formed thereon by either the low temperature CVD method or the plasma CVD method. The chip boundary 55 is a portion to be diced upon cutting the silicon wafer 51 on which the circuit components are formed. On the chip boundary 55, the insulating films 52 and 54 are removed by either the photoetching method or the selection etching method.

Thereafter, as shown in FIG. 5b, metal films of a metal such as TiAu, or CrAu are formed sequentially so as to be stacked on substantially the whole surface of the silicon wafer 51, which results in a multilayer film. Then, the multilayer film is etched by either the photoetching method or the selection etching method so as to have a predetermined pattern, which results in a multilayer layer film 56. Thereafter, partial portions of the multilayer metal film 56 located above the chip boundary 55 are etched by the photoetching method or the selection etching method, and then, the exposed top surface of the silicon wafer 51 is etched by the anisotropy etching method using an alkaline etching liquid such as KOH, or NaOH so as to form grooves 57 therein. At that time, since there is used the silicon wafer 51 having a surface orientation of (100), the top surface of the silicon wafer 51 is etched in parallel to the plane (111) using the alkaline etching liquid, which results in the V-shaped grooves 57, wherein the depth of each groove 57 is determined depending on the pattern configuration located in the vicinity of the exposed top surface of the silicon wafer 51.

Thereafter, each metal film of the multilayer metal film 56 is etched sequentially using either aqua regia or concentrated sulfuric acid so as to completely remove the multilayer metal film 56, and then, an electrically insulating film 58 of an electrically insulating material such as SiO$_2$, or SiN is formed thereon by either the low temperature CVD method or the plasma CVD method so as to coat the top surface of the silicon wafer 51 and the side surfaces of respective grooves 57 therewith, as shown in FIG. 5c. After the insulating films 58 and 54 located at a predetermined portion above the electrode film 53 are removed sequentially by either the photoetching method or the selection etching method, so as to form an electrode window 59, a protection substrate 61 of a material such as glass is bonded thereon through an adhesive layer 60 of wax.

Thereafter, the silicon wafer 51 is shaped into a plate configuration having a predetermined thickness by processing the bottom surface of the silicon wafer 51 by a mechanical method such as a lapping method, or a polishing method, so as to expose the grooves 57 to the bottom surface thereof. Alternatively, there may be used a chemical method having an alkaline etching liquid such as KOH, or NaOH. Thereafter, the silicon wafer 51 is diced on the chip boundary 4 so as to divide it into respective semiconductor chips 92, as shown in FIG. 5d.

Thereafter, referring to FIG. 5e, the bottom surface of the semiconductor chip 92 and/or the top surface of the electrically insulating substrate 62 of an electrically insulating material such as ceramic, beryllia porcelain, or glass are coated with an adhesive of epoxy resin, or polyimide, and then, the semiconductor chip 92 is bonded through an adhesive layer 60 of wax on a predetermined position of the top surface of the insulating substrate 62 under the conditions of a predetermined pressure and a predetermined temperature.

Thereafter, the adhesive layer 60 is melted at a predetermined temperature, and then, the protection substrate 61 is removed so as to be separated from the chip 92 as shown in FIG. 5e, which results in a semiconductor chip 92a. Thereafter, as shown in FIG. 5f, after substantially the whole top surfaces of the insulating film 58 and the insulating substrate 62 are coated with an electrically conductive film of an electrically conductive material such as TiAu, CrAu, or Al by either the electron beam vapor deposition method or the sputtering method, the coated conductive film is etched by either the photoetching method or the selection etching method so as to form the electrically conductive film 64 having a predetermined pattern for leading the electrode film 53 into the top surface of the insulating substrate 62 through the inclined surface of the insulating substrate 62 through the inclined side surface of the semiconductor chip 92a, which becomes an interconnection film formed on the insulating substrate 62, which results in the desirable semiconductor apparatus of the fourth preferred embodiment shown in FIG. 5f.

In the semiconductor apparatus of the fourth preferred embodiment, since the silicon wafer 1 has a relatively small thickness, there is not caused any disconnection of the conductive film 64 due to steps located on the side surfaces of the chip 92a. Furthermore, since the width of the conductive film 64 can be narrowed by utilizing the photoetching method, many conductive films 64 can be led through the side surfaces of the chip 92a into the top surface of the insulating substrate 62.

Figure 6:
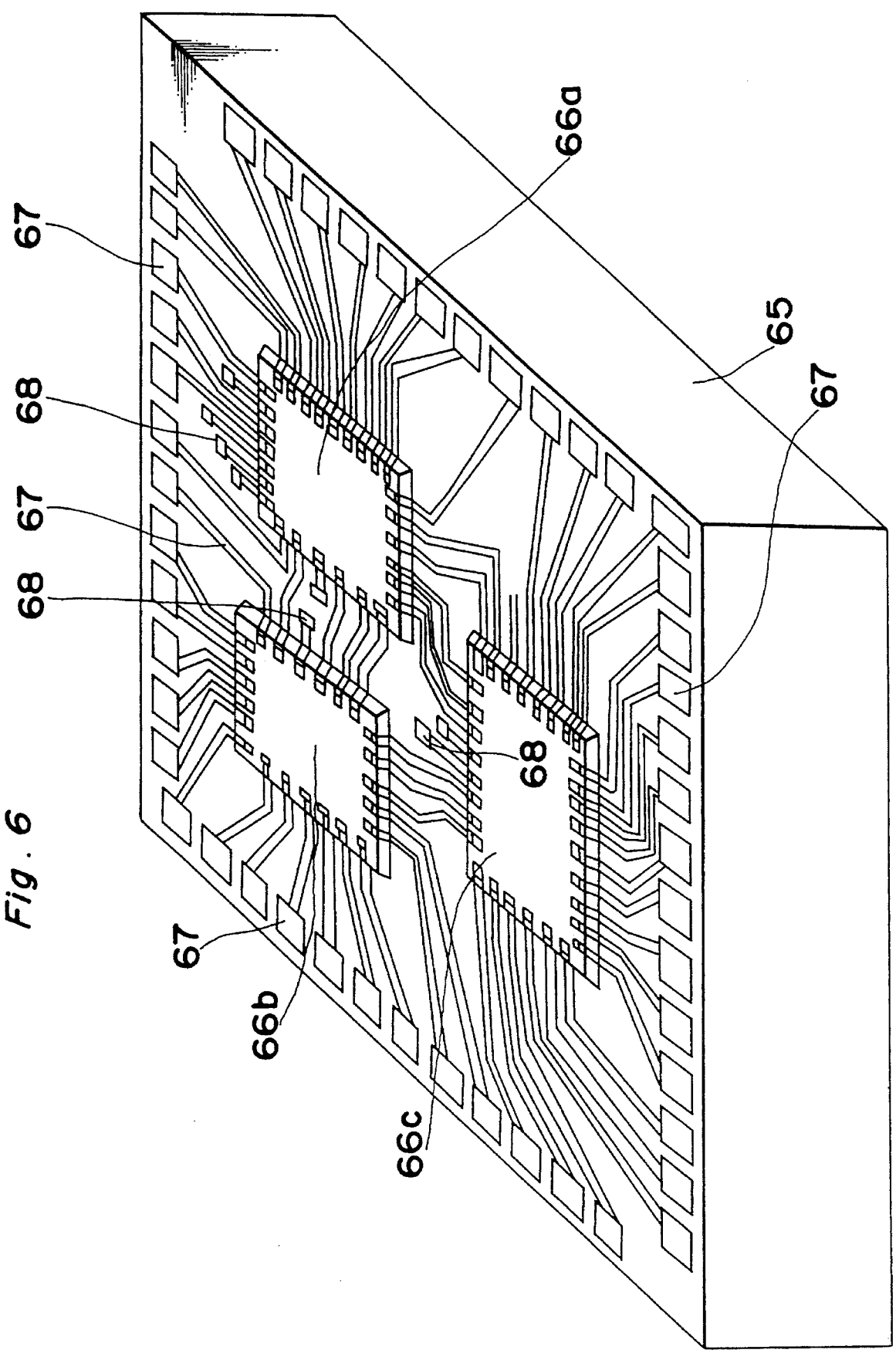
FIG. 6 is a schematic perspective view showing a semiconductor apparatus utilizing the semiconductor apparatuses shown in FIGS. 5a to 5f.

FIG. 6 shows one example of a semiconductor apparatus wherein a plurality of semiconductor chips 66a to 66c are arranged on an electrically insulating substrate 65.

Referring to FIG. 6, a plurality of semiconductor chips 66a to 66c are bonded on the insulating substrate 65 of an electrically insulating material such as ceramic, beryllia porcelain, or glass, on which electrically conductive films 67 connected to respective electrode films of each semiconductor are formed. On the insulating substrate 65 and under the conductive films 67, multilayer interconnection films (not shown) are formed so as to be stacked through electrically insulating films, and the multilayer interconnection films are connected to the conductive films 67 through through holes 68.

In a fabrication process of the semiconductor apparatus shown in FIG. 6, there are formed respective semiconductor chips 66a to 66c similar to that shown in FIG. 5d, and then, respective semiconductor chips 66a to 66c are bonded at predetermined positions of the insulating substrate 65. Thereafter, the semiconductor apparatus is fabricated in the manner similar to that of the fourth preferred embodiment as described above.

In the semiconductor apparatus shown in FIG. 6, since respective semiconductor chips 66a to 66c can be processed simultaneously after bonding them on the insulating substrate 65 and also the conductive film 67 is formed thereon simultaneously, the number of the fabrication processes per one semiconductor chip can be decreased, and the fabrication cost thereof can be lowered.

Fifth Preferred Embodiment

Figure 7:
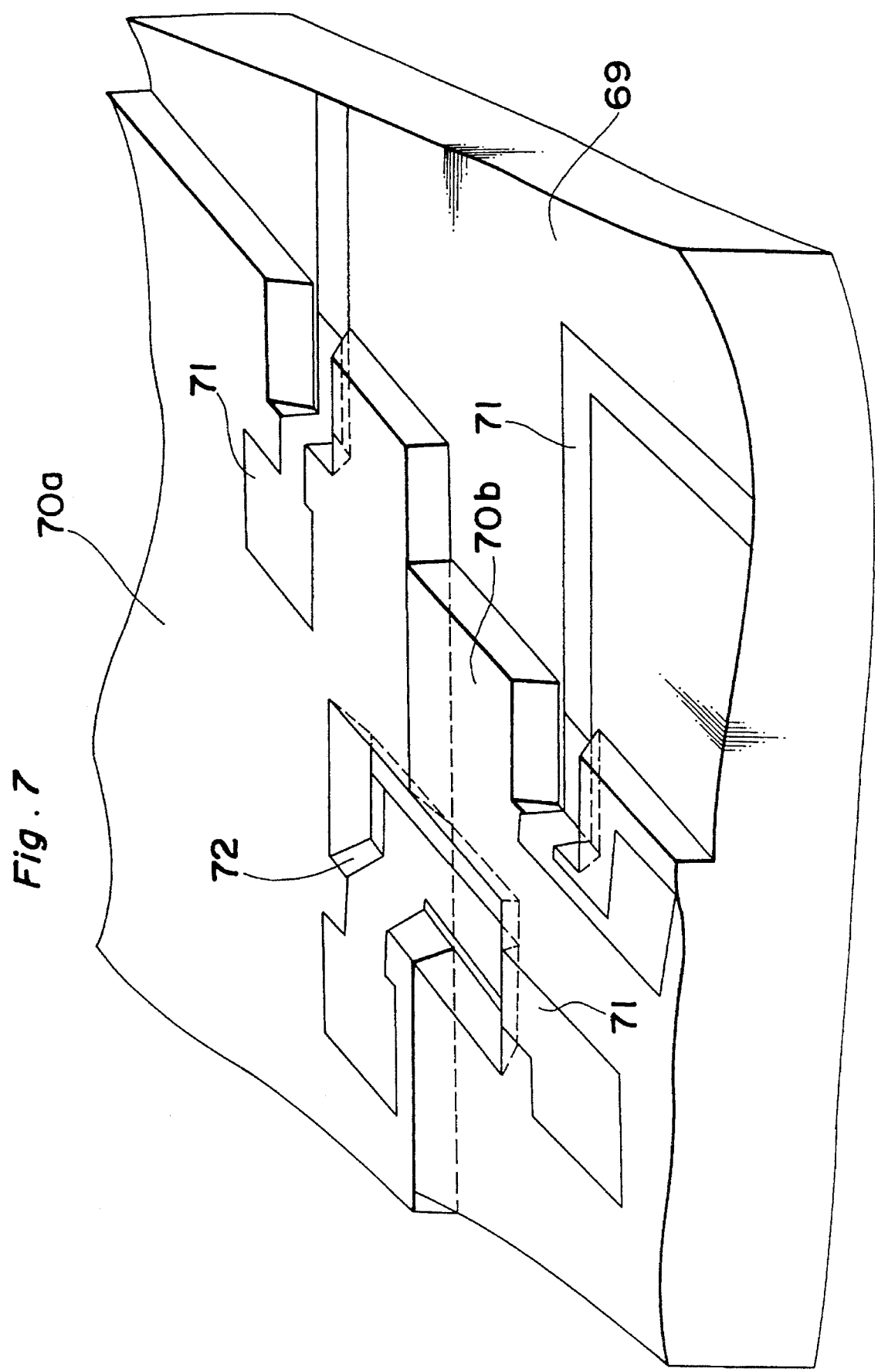
FIG. 7 is a schematic perspective view showing a semiconductor apparatus of a fifth preferred embodiment according to the present invention.

FIG. 7 shows a semiconductor apparatus of a fifth preferred embodiment according to the present invention. The semiconductor apparatus thereof is characterized in that a plurality of semiconductor chips 70a and 70b are arranged in a high density on an electrically insulating substrate 69 so as to be adjacent to each other.

Referring to FIG. 7, the semiconductor chips 70a and 70b are bonded on the insulating substrate 69 so as to be adjacent to each other, and electrode films (not shown) of each semiconductor chip are led into the top surface of the insulating substrate 69 by electrically conductive films 71, which are formed on respective top surfaces of the insulating substrate 69 and respective semiconductor chips 70a and 70b, and side surfaces 72 thereof, wherein the side surfaces 72 are on the inside of the end surfaces thereof and are adjacent to each other.

A fabrication process of the semiconductor apparatus of the present preferred embodiment is as follows.

The processes shown in FIGS. 5a and 5b for forming the grooves 57 in the fourth preferred embodiment are performed in the manner similar to that of the fourth preferred embodiment, except that the multilayer metal film 56 has such a mask pattern that the side surfaces 72 of the semiconductor chip are on the inside of the end surfaces thereof and grooves having a rectangular parallelopiped shape can be formed. Thereafter, the fabrication processes shown in FIGS. 5c to 5f are performed in the manner similar to that of the fourth preferred embodiment, which results in the semiconductor apparatus shown in FIG. 7.

In the semiconductor apparatus of the present preferred embodiment, because the length of the conductive film 71 formed between the adjacent semiconductor chips 70a and 70b can be shortened, there is no problem of delay of signals transmitted between the adjacent semiconductor chips 70a and 70b. Furthermore, a semiconductor apparatus wherein a plurality of semiconductor chips are arranged in a high density can be fabricated.

Sixth Preferred Embodiment

Figure 8A:
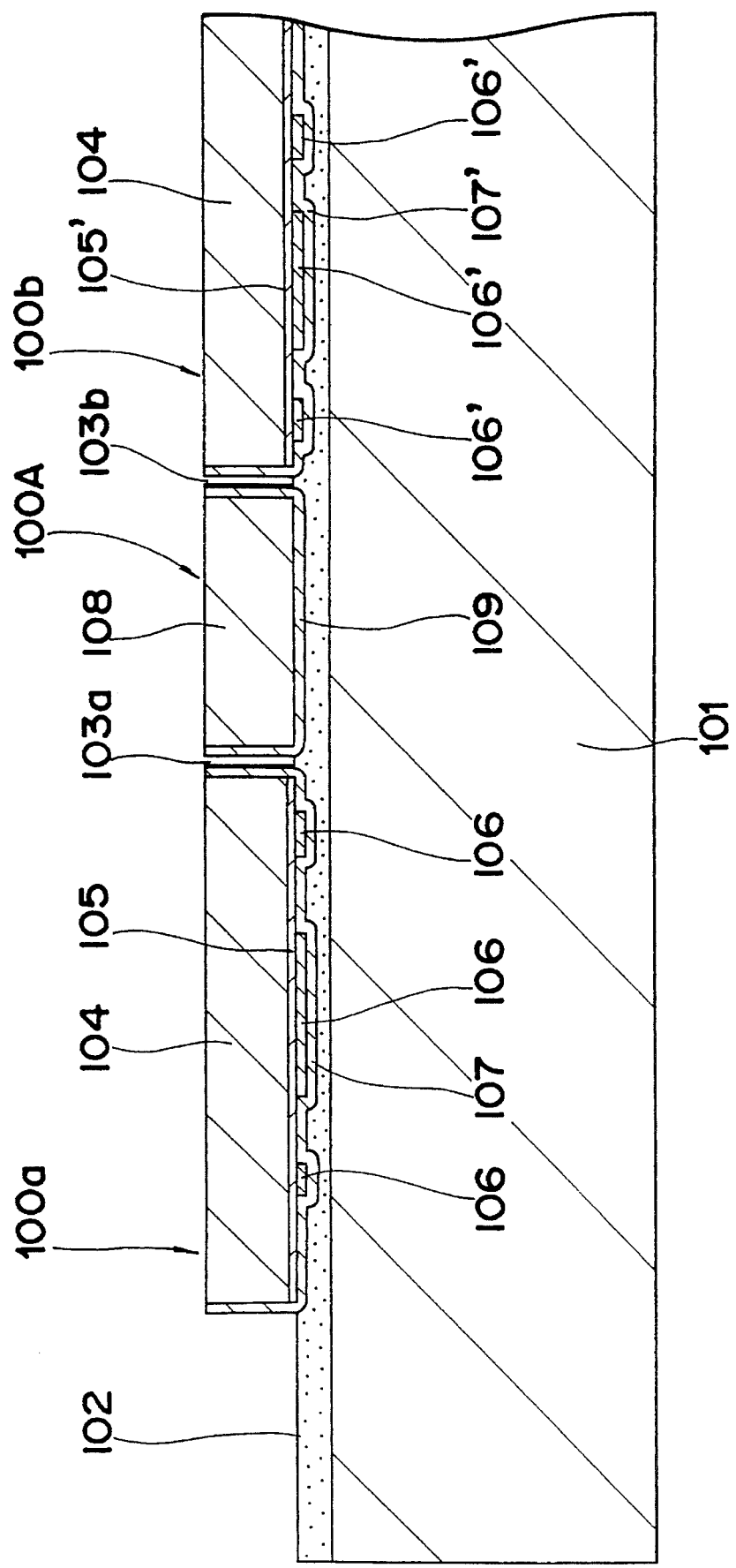
Figure 8B:
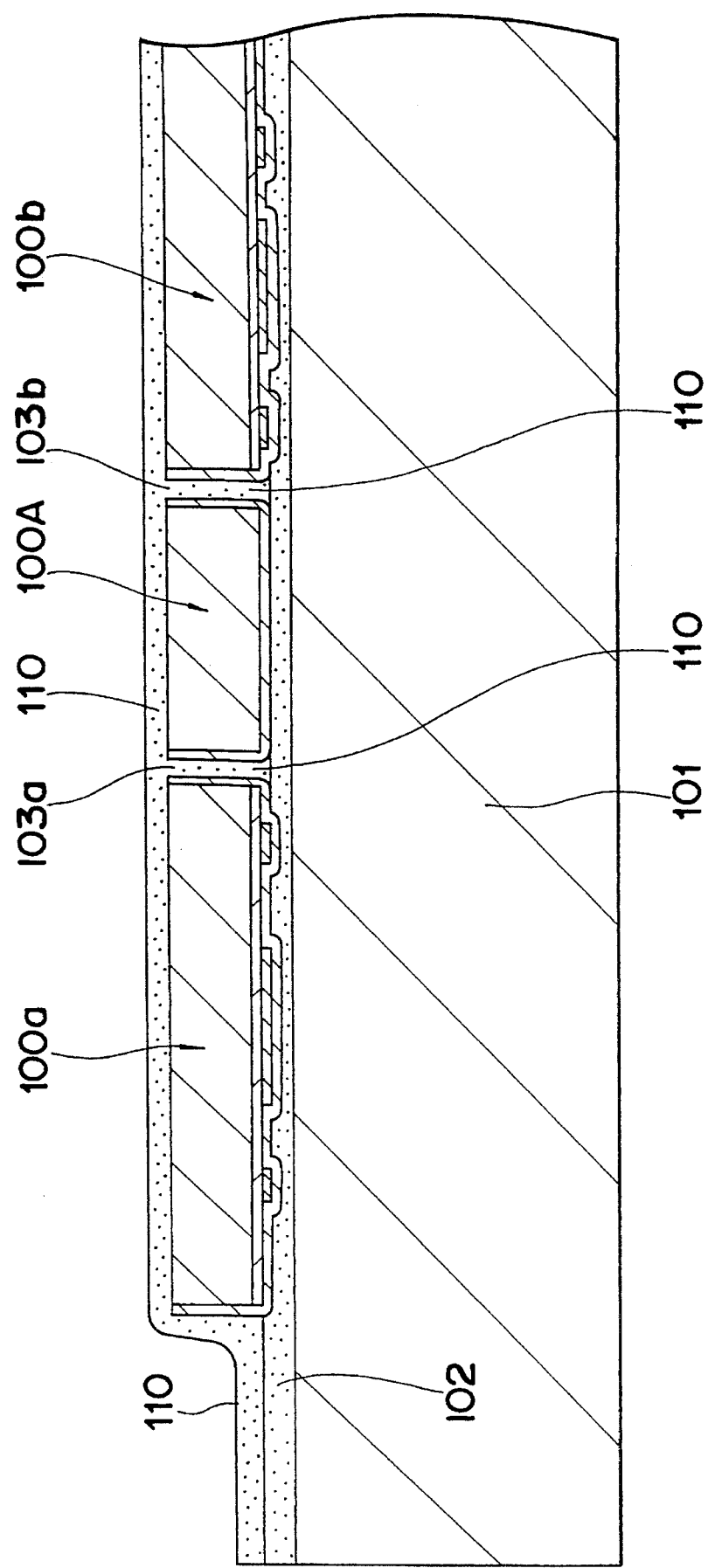

FIG. 8d is a cross-sectional view showing a semiconductor apparatus including an assembled chip 100Z of a sixth preferred embodiment according to the present invention, and FIGS. 8a to 8c are cross-sectional views showing a fabrication process of the semiconductor apparatus thereof. The assembled semiconductor chip 100Z is characterized in that a plurality of semiconductor chips 100a and 100b are bonded through a mediation chip 100A so that side surfaces thereof are coupled onto each other, which results in an assembled chip 100Z to be arranged on an electrically insulating substrate, as shown in FIG. 8d.

FIG. 9 is a schematic perspective view showing a semiconductor apparatus wherein semiconductor chips 100a to 100f and the mediation chip 100A are bonded on a substrate 101, and FIG. 8a is a cross-sectional view along A—A' line of FIG. 9.

Referring to FIG. 8a, on the top surface of the substrate 101 of a material such as glass, ceramic, or metal, there are bonded the semiconductor chips 100a and 100b including integrated circuits etc., and the mediation chip 100A without any circuit components, through an adhesive layer 102 of wax, so that the mediation chip 100A is arranged between the semiconductor chips 100a and 100b, and the side surfaces thereof are coupled onto each other. The semiconductor apparatus shown in FIG. 8a is fabricated as follows.

First of all, the top surface of the substrate 101 is coated with wax liquid using a spinner so as to form the film-shaped adhesive layer 102 of wax thereon, and then, the nondefective semiconductor chips 100a and 100b including integrated circuits and the mediation chip 100A are bonded on the substrate 101 through the adhesive layer 102 under the conditions of a predetermined temperature and a predetermined pressure, so that the chips 100a and 100A are apart from each other by a gap 103a, and the chips 100b and 100A are apart from each other by a gap 103b.

The semiconductor chip 100a includes a silicon wafer 104 of silicon single crystal, an electrically insulating film 105, electrode films 106, and an electrically insulating protection film 107 for protecting the top and side surfaces of the semiconductor chip 100a, and the semiconductor chip 100b includes a silicon wafer 104' of silicon single crystal, an electrically insulating film 105', electrode films 106', and an electrically insulating protection film 107' for protecting the top and side surfaces of the semiconductor chip 100b.

In the fabrication process of the semiconductor chips 100a and 100b, on the top surface of the silicon wafer 104 of silicon single crystal, in a manner similar to that of fabricating a conventional integrated circuit well known to those skilled in the art, there are formed circuit devices such as MOSFETs utilizing the insulating films 105 and 105' of an electrically insulating material such as $SiO_2$, or SiN which are formed by either the thermal oxidation method or the CVD method. After electrode windows are formed by either the photoetching method or the selection etching method in predetermined areas of the insulating films 105 and 105' where the electrode films 106 and 106' will be formed, a metal film of a metal such as Al, Mo, W, or WSi is formed on substantially the whole surface of the silicon wafer 104, and then, the metal film is etched by either the photoetching method or the selection etching method so as to form a predetermined pattern, which results in the electrode films 106 and 106'.

Thereafter, the performance of respective chips are checked, and nondefective semiconductor chips 100a and 100b are picked up among the semiconductor chips. The top and side surfaces of each of the semiconductor chips 100a and 100b are coated by the low temperature CVD method with the insulating films 107 and 107' of an electrically insulating material such as $SiO_2$, or SiN for protecting them.

On the other hand, the mediation chip 100A is fabricated as follows. After there is diced a silicon wafer 108 of silicon single crystal having substantially the same thickness as that of the silicon wafer 104 so as to be shaped into a chip configuration, the top and side surfaces thereof are coated with an insulating film 109 of an electrically insulating material such as $SiO_2$, or SiN, which results in the mediation chip 100A without any circuit components.

Thereafter, the semiconductor chips 100a and 100b with the integrated circuits and the mediation chip 100A without any circuit components are bonded on the substrate 101 through an adhesive layer 102 of wax, so that the mediation chip 100A is arranged between the semiconductor chips 100a and 100b, and the side surfaces thereof are coupled onto each other, which results in the semiconductor apparatus shown in FIG. 8a.

Thereafter, as shown in FIG. 8b, respective top surfaces of the substrate 101, the semiconductor chips 100a and 100b, and the mediation chip 100A are coated by either the dipping method or a coating method using a spinner with a thermosetting resin such as epoxy resin, polyimide so as to fill it up within the gaps 103a and 103b, and then, the coated resin is hardened at such a predetermined temperature that the adhesive layer 102 does not melt, which results in a reinforcement adhesive layer 110.

Thereafter, the adhesive layer 102 is melted at a predetermined temperature, and then, unnecessary partial portions of the reinforcement adhesive layer 110 located at respective end portions of the semiconductor chips 100a and 100b are removed, which results in the assembled chip 100Z including the semiconductor chips 100a and 100b and the mediation chip 100A as shown in FIG. 8c.

In the present preferred embodiment, the thickness of each of the semiconductor chips 100a and 100b and the mediation chip 100A is in the range from about 300 µm to about 1 mm. Therefore, the assembled chip 100Z which has been assembled integrally by the reinforcement adhesive layer 110 has enough strength for processing in the following fabrication process and also to be used.

Thereafter, as shown in FIG. 8d, electrode windows 111 and 111' are formed by either the photoetching method or the selection etching method in the insulating films 107 and 107' located above predetermined ones of the electrode films 106 and above predetermined ones of the electrode films 106'. After either a one-layer metal film of a metal such as Al, Mo, or W, or a multilayer film of an electrically conductive material such as TiAu, or CrAu is formed on substantially the whole top surface of the assembled chip 100Z by either the electron beam vapor deposition method or the sputtering method, the film is etched by either the photoetching method or the selection etching method so as to have a predetermined pattern, which results in an interconnection film 112 for connecting respective electrodes of the circuit components thereof to each other. It is to be noted that the interconnection film 112 may be formed by either the selection electroless plating method or the selection electro plating method.

Thereafter, respective top surfaces of the assembled chip 100Z and the interconnection film 112 are coated with a thermosetting resin such as polyimide, epoxy resin, and then, the resin is hardened under the condition of a predetermined temperature, which results in an electrically insulating film 113 of the resin. After the insulating film 113 and the insulating films 107 and 107' are etched by either the photoetching method or the selection etching method so as to have predetermined patterns, electrode windows 114 and 114' are produced. Thereafter, an interconnection film 115 of an electrically conductive material is formed thereon in the manner similar to that of the interconnection film 112, so as to have a predetermined pattern, which results in the desirable semiconductor apparatus shown in FIG. 8d.

Seventh Preferred Embodiment

Figure 10:
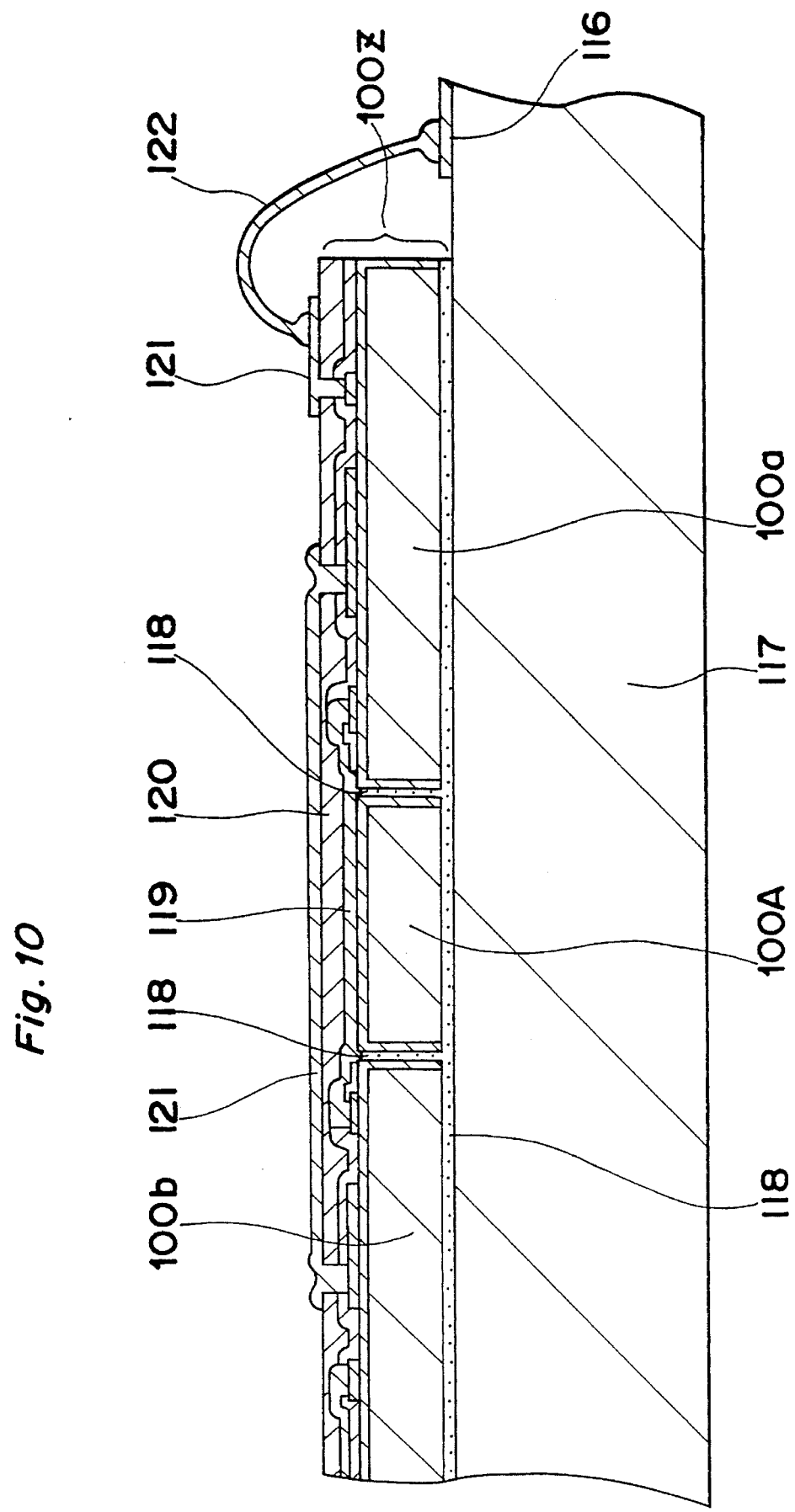
FIG. 10 is a cross-sectional view showing a semiconductor apparatus of a seventh preferred embodiment according to the present invention.
Figure 11:
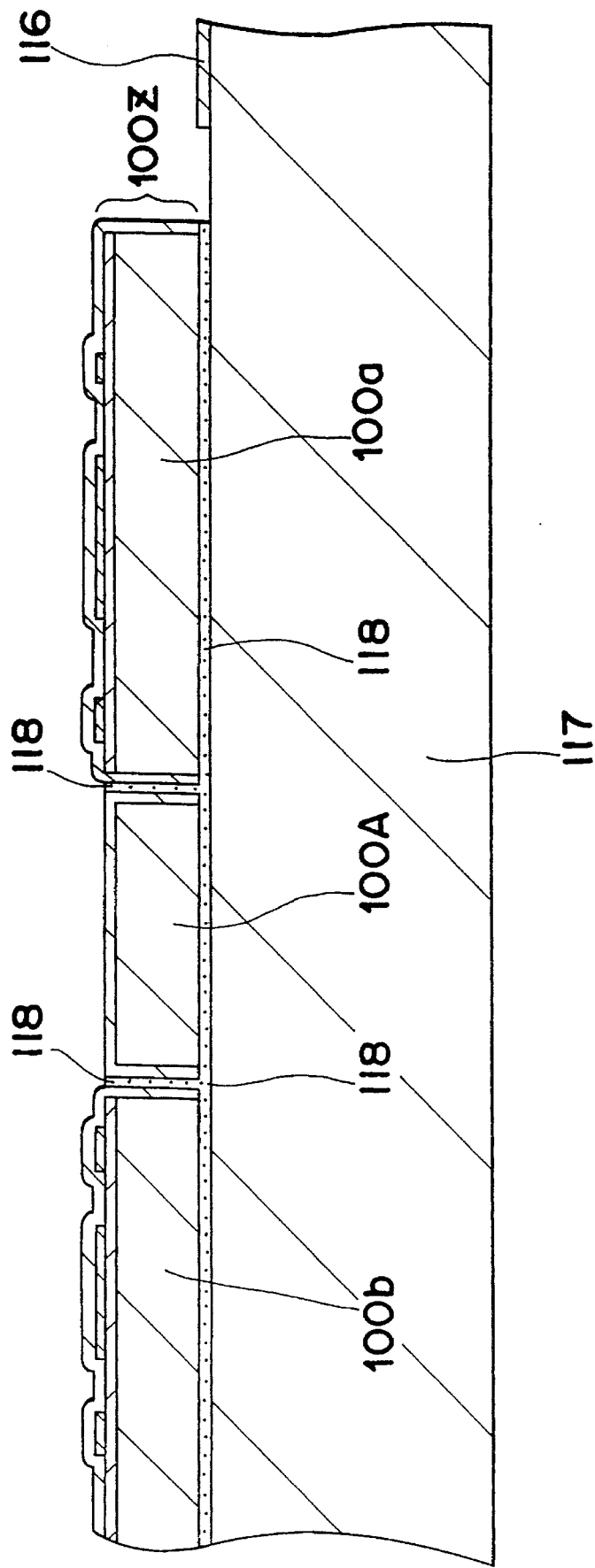
FIG. 11 is a cross-sectional view showing a fabrication process of the semiconductor apparatus shown in FIG. 10.

FIG. 10 is a cross-sectional view showing a semiconductor apparatus including an assembled chip 100Z of a seventh preferred embodiment according to the present invention, and FIG. 11 is a cross-sectional view showing a fabrication process of the semiconductor apparatus shown in FIG. 10. In FIGS. 10 and 11, the components similar to that shown in FIGS. 8a to 8d and 9 are denoted by the same numerical references shown in FIGS. 8a to 8d and 9. The semiconductor apparatus thereof is characterized in that an assembled chip 100Z including semiconductor chips 100a and 100b and a mediation chip 100A are bonded on a top surface of an electrically insulating substrate 117 on which an interconnection film 121 for connecting lead wires 122, as shown in FIG. 10.

A fabrication process of the semiconductor apparatus of the present preferred embodiment will be described below with reference to FIGS. 10 and 11.

The semiconductor chips 100a and 100b and the mediation chip 100A are formed in the manner similar to that of the sixth preferred embodiment.

FIG. 11 shows a fabrication process of the semiconductor apparatus when the assembled chip 100Z including the semiconductor chips 100a and 100b and the mediation chip 100A is bonded through an adhesive layer 118 on the substrate 117 on which the interconnection film 116 for connecting the lead wires 122 is formed.

Referring to FIG. 11, first of all, the bottom surface of the semiconductor chip 100a and/or the top surface of the insulating substrate 117 are coated with an adhesive such as epoxy resin, or polyimide, and then, the semiconductor chip 100a is bonded on a predetermined position of the insulating substrate 117. Thereafter, the bottom surface of the mediation chip 100A and/or the side surface thereof which opposes the semiconductor chip 100a are coated with an adhesive such as epoxy resin, or polyimide, and then, the mediation chip 100A is bonded through an adhesive layer 118 on a predetermined position of the insulating substrate 117 so as to be adjacent and coupled to the semiconductor chip 100a through the adhesive layer 118.

Similarly, the semiconductor chip 100b is bonded through the adhesive layer 118 on a predetermined position of the substrate 117 so as to be adjacent and coupled to the mediation chip 100A. Thereafter, the adhesive layer 118 is hardened at a predetermined temperature, which results in the assembled chip 100Z.

It is to be noted that, there may be set such a state that the semiconductor chips 100a and 100b and the mediation chip 100A are turned over, and then, the chips 100a, 100A and 100b are bonded with an adhesive such as epoxy resin, or polyimide, and further, the chips 100a, 100A and 100b are bonded on a predetermined position of the substrate 117, which results in the assembled chip 100Z.

Thereafter, as shown in FIG. 10, in a similar manner to that of the sixth preferred embodiment, there are formed a first interconnection film 119, an electrically insulating film 120, and a second interconnection film 121 on the top surface of the assembled chip 100Z, and then, a predetermined portion of the second interconnection film 121 is electrically connected to the interconnection film 116 by the lead wire 122, which results in the desirable semiconductor apparatus of the seventh preferred embodiment shown in FIG. 10.

In the seventh preferred embodiment, since the assembled chip 100Z is integrally bonded on the substrate 117, the assembled chip 100Z has a relatively high strength. Therefore, it becomes easy to fabricate the semiconductor apparatus, and also the other semiconductor chips and circuit components can be arranged on the substrate 117. As the result, the semiconductor apparatus having a high added value can be obtained.

Eighth Preferred Embodiment

Figure 12:
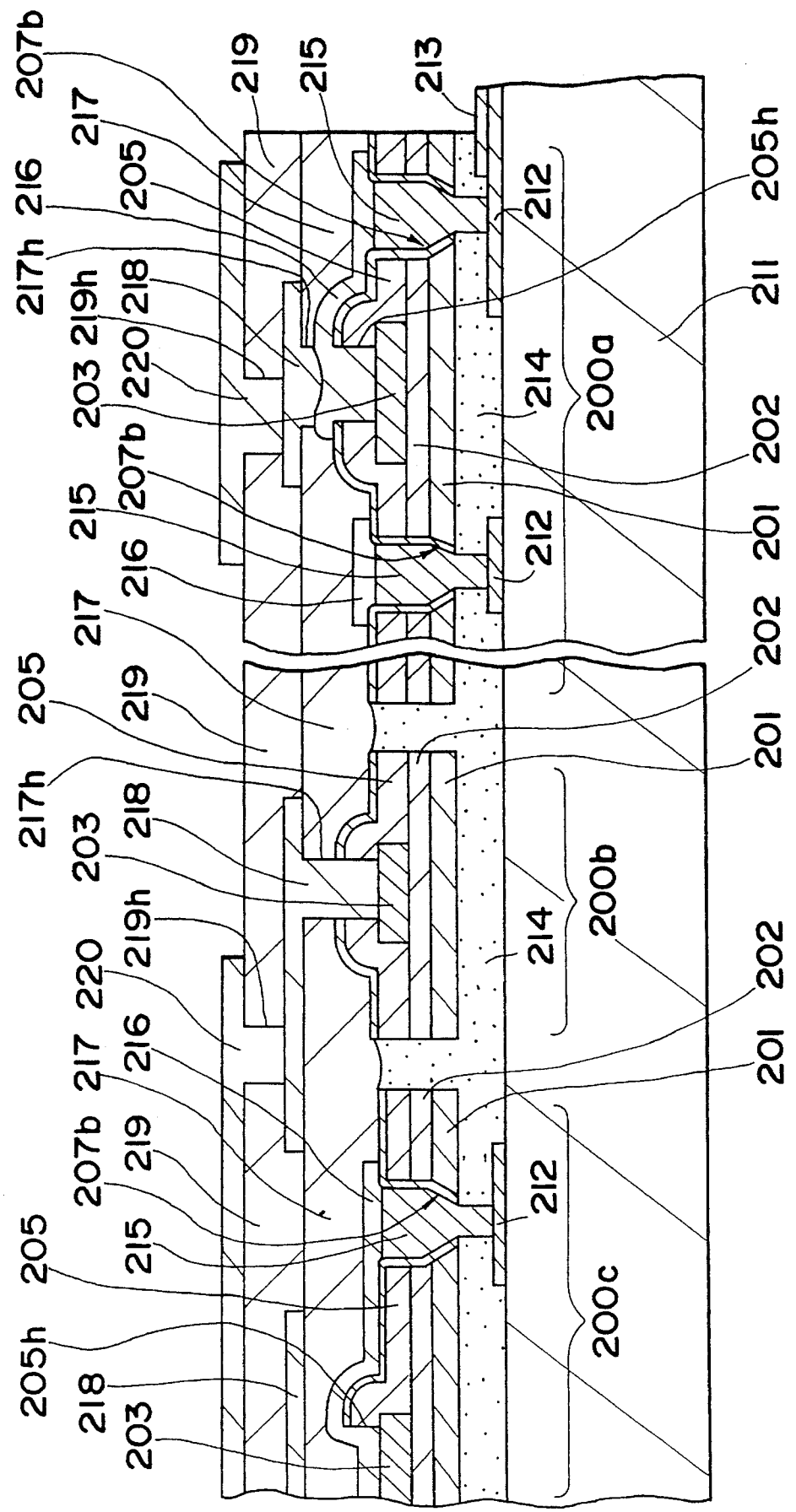
FIG. 12 is a cross-sectional view showing a semiconductor apparatus of an eighth preferred embodiment according to the present invention.

FIG. 12 is a cross-sectional view showing a semiconductor apparatus of an eighth preferred embodiment according to the present invention.

Referring to FIG. 12, an interconnection film 212 is formed on an electrically insulating substrate 211. Semiconductor chips 200a and 200b with integrated circuits are bonded on predetermined positions of the insulating substrate 211 through an adhesive layer 214, respectively. Further, between the semiconductor chips 200a and 200b on the insulating substrate 211, there is bonded a mediation chip 200b through the adhesive layer 214 in order to keep the top surface of the insulating substrate 211 flat and also to certainly form interconnection films for connecting the semiconductor chips 200a and 200c to each other. It is to be noted that, above the mediation chip 200b, there may be formed interconnection films sequentially in order to connect the other chips easily.

In the semiconductor chips 200a and 200c, there are formed a plurality of through holes 207b which pierce respective chips 200a and 200c, and an electrically conductive body 215 is stuffed in each through hole 207b. An interconnection film 212 formed on the insulating substrate 211 is electrically connected to the integrated circuit (not shown) formed on each of the semiconductor chips 200a and 200c and an interconnection film 203 through each conductive body 215 is stuffed in the through hole 207b. In the present preferred embodiment, as shown in FIG. 12, the interconnection film 203 formed above each of the semiconductor chips 200a and 200c is electrically connected to the interconnection films 212 formed on the insulating substrate 211.

Furthermore, respective top surfaces of the semiconductor chips 200a and 200c are coated with an electrically insulating film 217, and an interconnection film 218, which is formed on the insulating film 217 and in holes 217h formed in the insulating film 217, is electrically connected to the interconnection films 203 and 216 formed above the semiconductor chips 200a and 200c. Further, respective top surfaces of the insulating films 217 and 218 are coated with an electrically insulating film 219, and an interconnection film 220 is formed on the insulating film 219 and in holes 219h formed in the insulating film 219. It is to be noted that the interconnection film 212 formed on the insulating substrate 211 is coated with a protection film 213.

A fabrication process of the semiconductor apparatus shown in FIG. 12 will be described below with reference to FIGS. 13a to 13h.

Figure 13A:
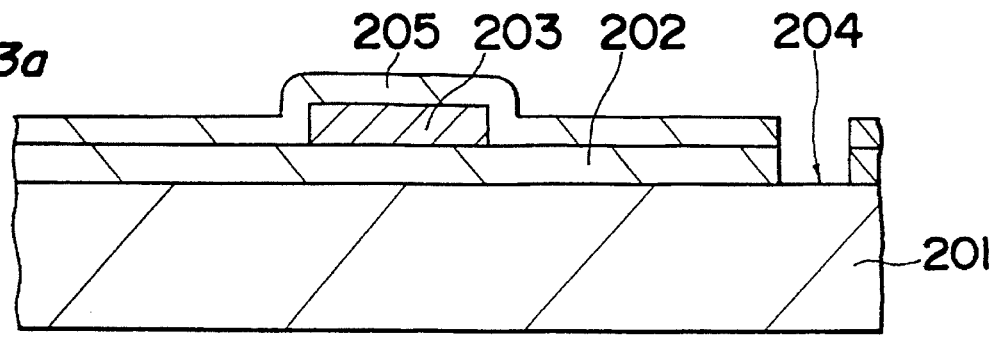
FIGS. 13a to 13h are cross-sectional views showing a fabrication process of the semiconductor apparatus shown in FIG. 12.

Referring to FIG. 13a, first of all, on a top surface of a silicon substrate 1 of silicon single crystal having a surface orientation of (100), there are formed various kinds of integrated circuit components (not shown) such as MOSFETs, diodes, resistors which include an electrically insulating film 202, an interconnection film 203, and a protection film 205 of an electrically insulating material for protecting the top surface thereof, in a manner similar to that of fabricating a conventional LSI well known to those skilled in the art. It is to be noted that each set of circuit components is formed for every chip on the silicon substrate 201, and thereafter, the silicon substrate 1 is diced on chip boundaries 204 so as to be divided into respective chips, and respective chips will be bonded on the insulating substrate 211. Therefore, the interconnection film 203 does not go across the chip boundary 204. The insulating films 202 and 205 etc. located on the chip boundaries 204 are etched so as to be completely removed.

Figure 13B:
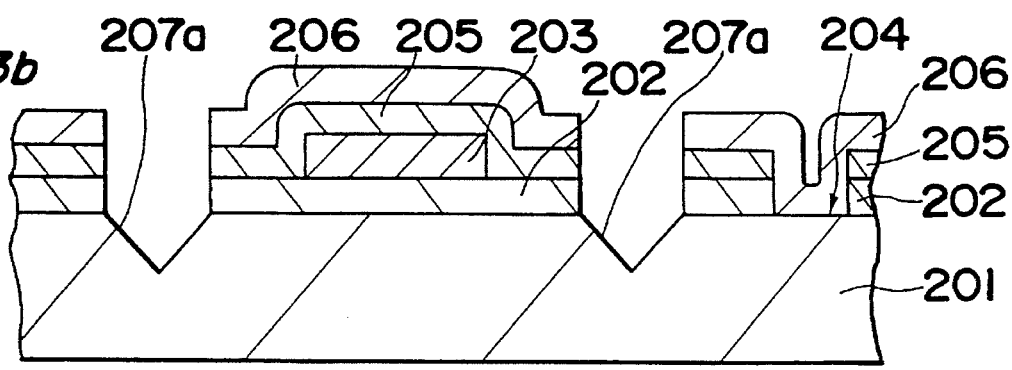

Referring to FIG. 13b, after forming the protection film 205 thereon, a metal layer of a metal such as TiAu is formed sequentially so as to be stacked a plurality of times on substantially the whole top surface of the silicon substrate 201, which results in a multilayer metal film 206. Thereafter, the multilayer metal film 206 is etched by either the photoetching method or the selection etching method so as to have a predetermined pattern for forming through holes 207b. Then, after the protection film 205 and the insulating film 202 are etched using the multilayer metal film 206 as a mask so as to be completely removed, the exposed top surface of the silicon substrate 201 where the multilayer metal film 206 is not covered is etched by the anisotropy etching method using an alkaline etching liquid such as KOH, or NaOH so as to form holes 207a therein, which are surrounded by four surfaces thereof. At that time, there is used the silicon substrate 201 having a surface orientation (100), the top surface thereof is etched in parallel to the plane (111), which results in the V-shaped holes 207a shown in the cross-sectional view of FIG. 13b.

It is to be noted that, in the present preferred embodiment, the exposed top surface of the silicon substrate 201 is etched by the anisotropy etching method using the alkaline etching liquid so as to form the V-shaped holes 207a having a taper portion therein, however, the present embodiment is not limited to this. Holes having another shape may be formed therein by the isotropy etching method such as the acid etching method using a mixed liquid of HF and $HNO_3$.

Figure 13C:
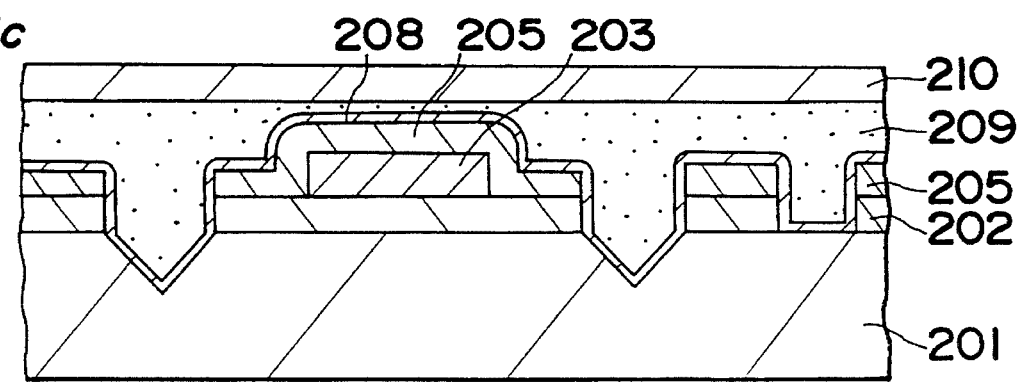
Figure 13D:
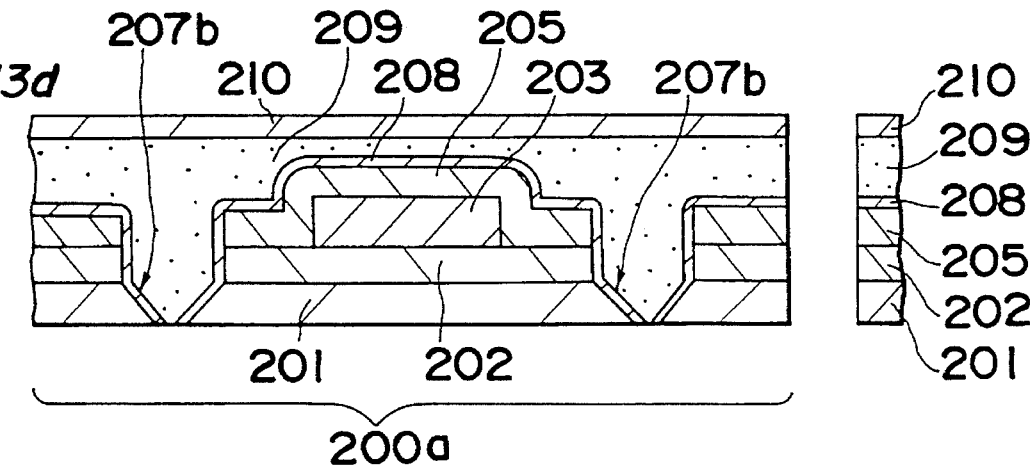

Thereafter, each metal film of the multilayer metal film 206 is etched sequentially using either aqua regia or concentrated sulfuric acid so as to be removed completely, an electrically insulating film 208 is formed on substantially the whole top surface of the silicon substrate 201 as shown in FIG. 13*c*, and then, a protection substrate 210 is bonded thereon through an adhesive layer 209 of wax. The protection substrate 210 is preferably made of glass, or acrylic resin.

Thereafter, the silicon substrate 201 is shaped into a thin plate configuration having a predetermined thickness by processing the bottom surface thereof by a physical method such as a lapping method, a polishing, so as to expose the holes 207*a* to the bottom surface thereof, which results in the holes 207*a* piercing the silicon substrate 201. Alternatively, there may be used a chemical method using an alkaline etching liquid such as KOH, or NaOH. Thereafter, the silicon substrate 201 is diced on the chip boundaries 204 so as to be divided into many chips 200*a*. The performance of each chip 200*a* is checked, and then, only nondefective chips 200*a* which can operate normally are picked up among all the made chips 200*a*, and are used in the following process.

Similarly, the various kinds of chips 200*b* and 200*c* other than the chip 200*a* are fabricated.

Figure 13E:
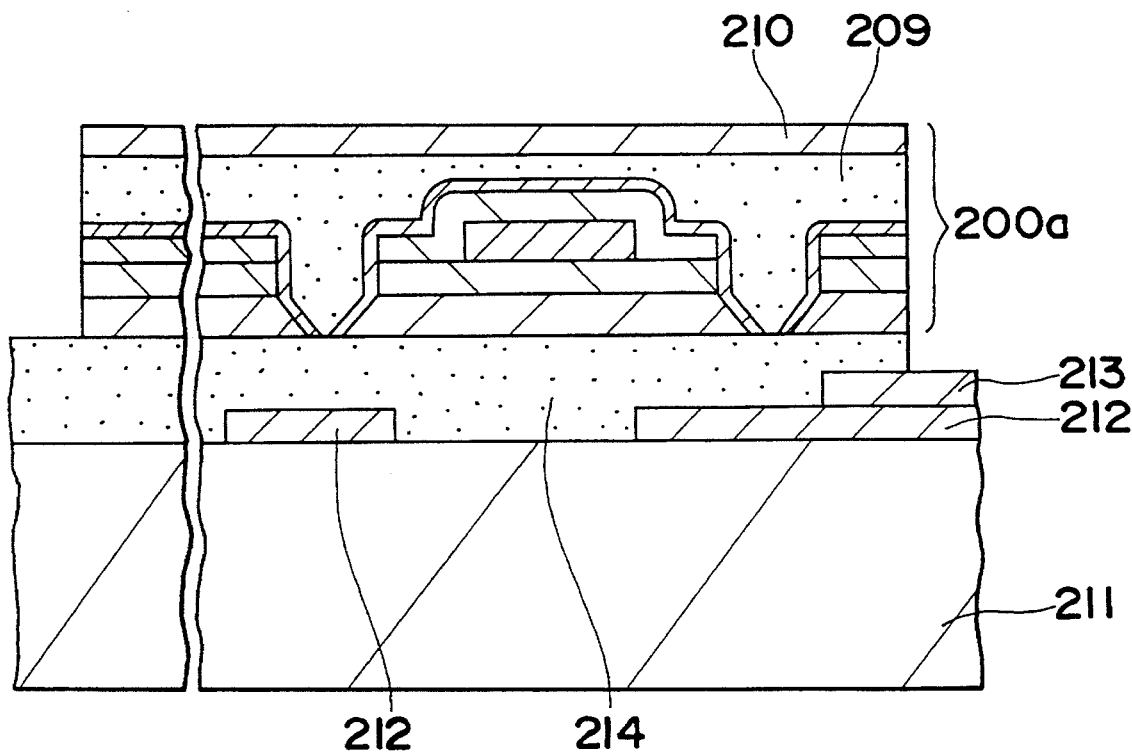

Thereafter, as shown in FIG. 13*e*, respective chips are bonded on predetermined positions of the insulating substrate 211, as described later in detail. The insulating substrate 211 is preferably made of an electrically insulating material such as ceramic, beryllia porcelain, or glass. The interconnection film 212 having a predetermined pattern is formed on the top surface of the insulating substrate 211, and partial portions of the interconnection film 212 are coated with the protection film 213, wherein the interconnection film 212 is preferably either a thin film of an alloy such as TiAu, or CrAu, or a thick film such as Au paste.

After the bottom surface of the chip 200*a* and/or the protection film 213 formed on the insulating film 211 are coated with an adhesive 214 of a resin such as epoxy resin, or polyimide, the chip 200*a* is bonded on a predetermined position of the insulating substrate 211 at a predetermined temperature by applying a force thereonto, as shown in FIG. 13*e*.

Figure 13F:
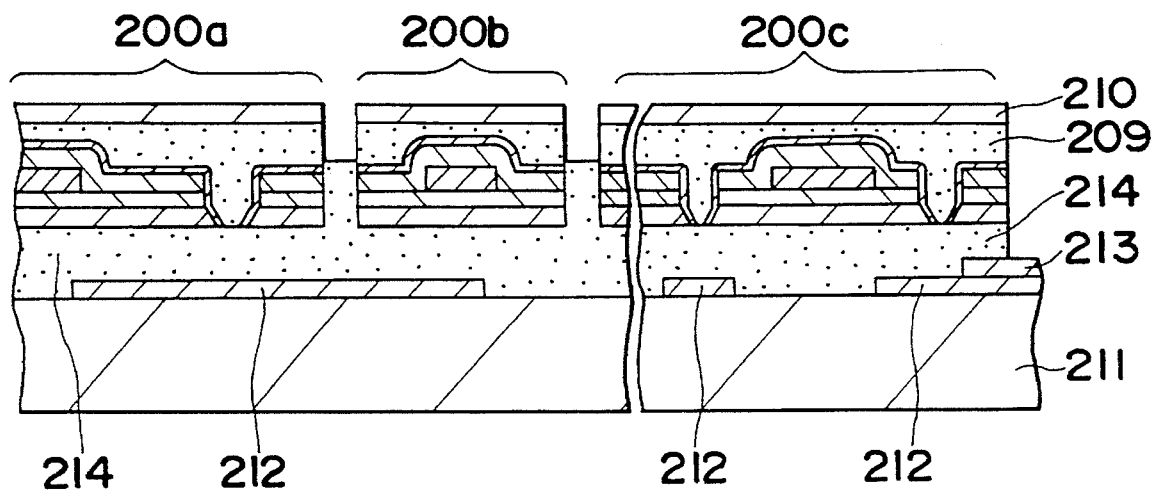

Thereafter, the chips 200*b* and 200*c* are bonded on predetermined positions of the insulating substrate 211, respectively, in the manner similar to that of the chip 200*a*, as shown in FIG. 13*f*.

Respective chips 200*a* to 200*c* formed on the insulating substrate 211 can be designed so as to have various kinds of functions. For example, there can be used a chip having a logic function, a chip having a memory function, or a chip having a combination of the aforementioned functions and the other kinds of functions. Furthermore, there can be used a chip without any active device on which only interconnection films are formed, or a chip having only the function for embedding a step formed between chips on which there is not any interconnection film formed. Thus, the aforementioned various kinds of chips can be used depending on the use in the present preferred embodiment.

Figure 13G:
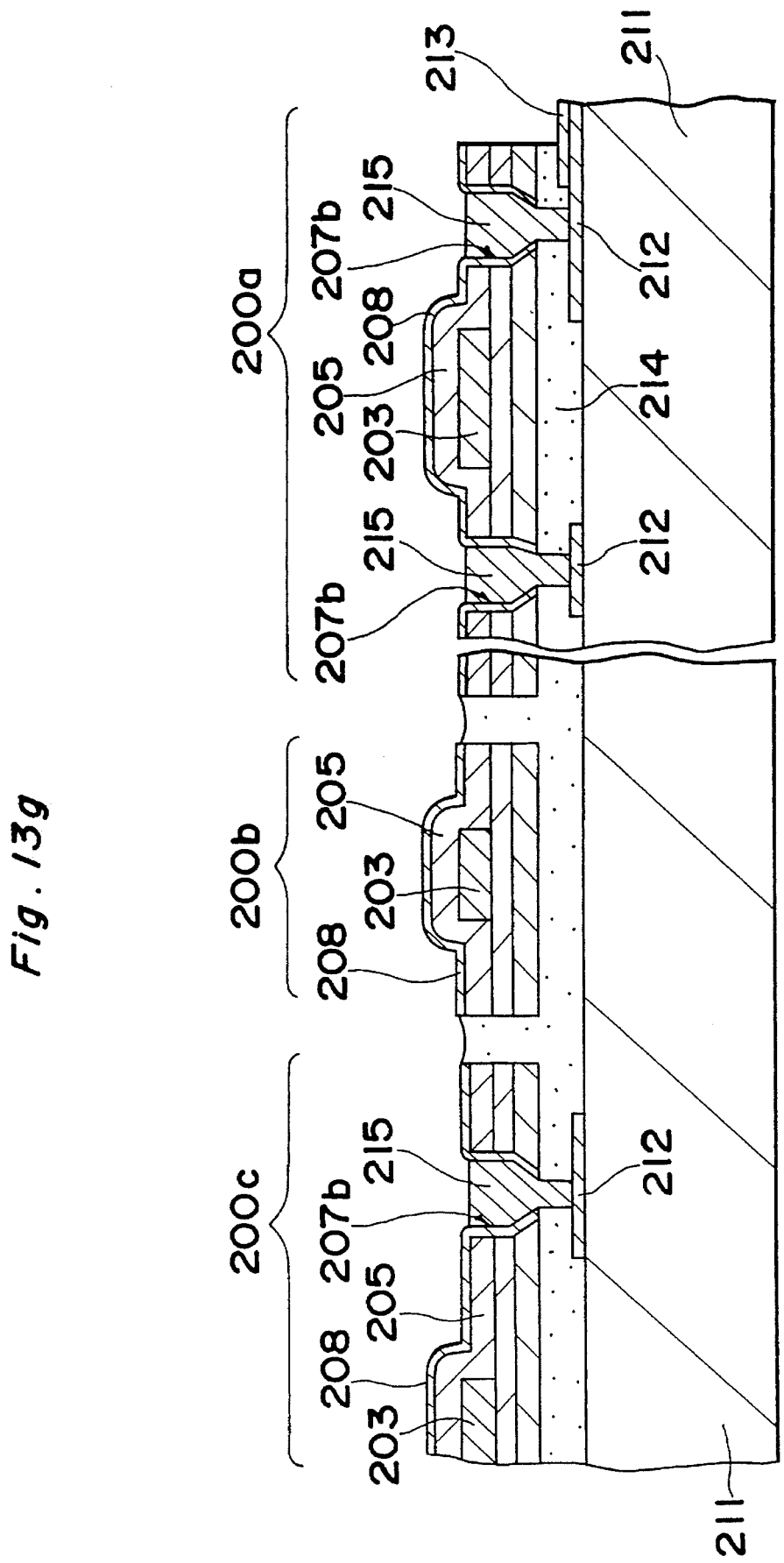

Thereafter, referring to FIG. 13*g*, the adhesive layer 209 is melted by heating it, and then, the protection substrate 210 is removed so as to be separated from the chips 200*a* and 200*c*. Then, the adhesive layer 209 exposed in the through hole 207*b* is etched so as to be removed by either a chemical method using sulfuric acid or a physical method such the plasma etching method, so that partial portions of the top surface of the interconnection film 212 are exposed. Thereafter, an electrically conductive body 215 of a metal such as Ni is stuffed in the through holes 207*b* by the electroless plating method.

Figure 13H:
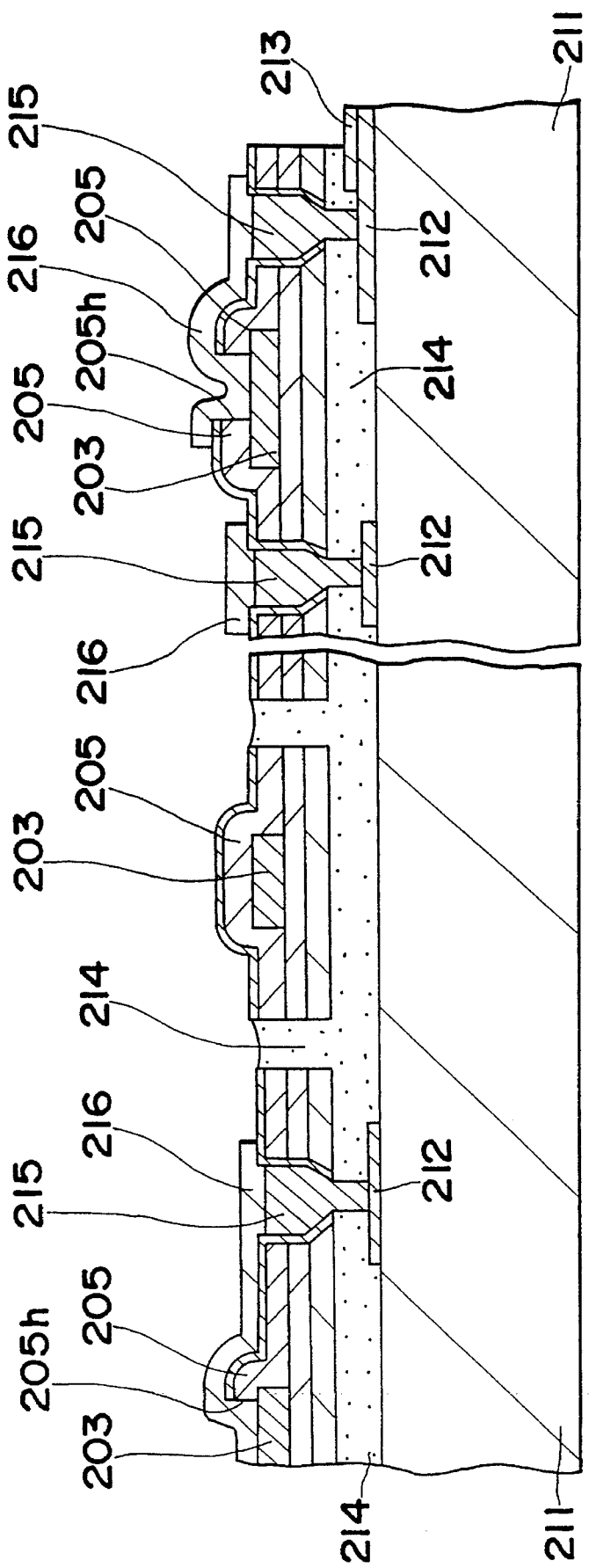

Thereafter, referring to FIG. 13*h*, holes 205*h* are formed at predetermined portions of the insulating film 205 formed on the interconnection film 203 by a conventional etching method well known to those skilled in the art so as to reach the interconnection film 203, and then, a metal film is formed sequentially so as to be stacked by either the sputtering method, which results in the multilayer metal film. The multilayer metal film is etched by the photoetching method or the selection etching method so as to have a predetermined pattern, which results in an interconnection film 216, as shown in FIG. 13*h*. The interconnection film 216 is electrically connected to the interconnection film 212 formed on the insulating substrate 211 through the conductive body 215 stuffed in the through holes 207*b*, and is also electrically connected to the interconnection film 203 through the through holes 205*h*.

Thereafter, in the manner similar to that described above, the electrically insulating film 217 is formed thereon, and further, the interconnection film 218 of an electrically conductive material is formed thereon so as to have a predetermined pattern. Then, the electrically insulating film 217 is formed thereon, and an interconnection film 220 of an electrically conductive material is formed thereon so as to have a predetermined pattern, which results in the desirable semiconductor apparatus of the eighth preferred embodiment shown in FIG. 12.

In the present preferred embodiment, as described above, because the interconnection films of each chip can be electrically connected to the interconnection film 212 formed on the insulating substrate 211 through the conductive body 215 stuffed in the through hole 207*b* formed in each chip, each integrated circuit of the semiconductor apparatus can be designed more freely, and also the length of each interconnection film can be decreased. Therefore, each integrated circuit thereof can handle signals having higher frequencies, the noise caused therein can be lowered, and the power consumption thereof can be lowered. Further, the cost of designing semiconductor apparatuses can be lowered, and the time required for designing semiconductor apparatus can be reduced. Furthermore, it becomes unnecessary to provide connection pads to be formed on chips located in the outer edge portions of the substrate.

In the present preferred embodiment, the conductive body 215 is formed by stuffing the metal material in the through hole 207*b* by the electroless plating method, however, the present embodiment is not limited to this. In order to form the conductive body 215 therein, a metal film may be formed sequentially so as to be stacked by the sputtering method, which results in a multilayer metal film. Then, the multilayer film may be etched so as to have a predetermined pattern.

In the present preferred embodiment, the interconnection films 218 and 220 are formed. However, the present embodiment is not limited to this. The interconnection films 218 and 220 may not be formed if they are not necessary for designing each integrated circuit.

It is to be noted that each interconnection film is preferably made of an electrically conductive material such as Al, Mo, W, or $WSi_x$, and each insulating film and each protection film are preferably made of an electrically insulating material such as $SiO_2$, or SiN.

Ninth Preferred Embodiment

FIG. 14 is a cross-sectional view showing a semiconductor apparatus of a ninth preferred embodiment according to the present invention.

Referring to FIG. 14, on a top surface of an electrically insulating substrate 234 on which an interconnection film 233 is formed, a semiconductor chip 200d is bonded through an adhesive layer 232. On the semiconductor chip 200d, an electrically insulating film 222, an interconnection film 223 and integrated circuit components (not shown) are formed, and are coated with an electrically insulating film 229. The interconnection film 223 formed on the semiconductor chip 200d includes a connection pad 223a in the outer edge portions of the semiconductor chip 200d, and the connection pad 223a is in contact with the conductive body 235 formed in a through hole 223b which is formed in the insulating films 224 and 229. The conductive body 235 is also formed on predetermined portions of the side surfaces of the semiconductor chip 200d, and is in contact with the interconnection film 233 formed on the insulating substrate 234. Thus, the interconnection film 223 of the semiconductor chip 200d is electrically connected to the interconnection film 233 formed on the insulating substrate 234 through the connection pad 223a and the conductive body 235.

In the present preferred embodiment, because there is provided a taper portion 227t on each side surface of the semiconductor chip 200d, the conductive body 235 can be formed easily without any disconnection and in a high reliability. On the top surface of the insulating substrate 234, there are bonded many semiconductor chips in addition to the semiconductor chip 200d. Each circuit component formed on these semiconductor chips is electrically connected to each circuit component formed on the other semiconductor chips through interconnection films such as the interconnection film 233 formed on the insulating substrate 234, and the conductive body 235. Further, each circuit component formed on these semiconductor chips is coated with an electrically insulating film 237, and is electrically connected to an interconnection film 238 which is formed on the insulating film 237 and on internal surfaces of a hole 237h formed in the insulating film 237.

A fabrication process of the semiconductor apparatus of the present preferred embodiment will be described below with reference to FIGS. 15a, 15b, 16a, 16b, 17a, 17b, 18a, 18b, and 19a to 19d. In these FIGS., the components similar to that shown in FIGS. 12 and 13a to 13h are denoted by the same numerical references shown in FIGS. 12 and 13a to 13h.

Figure 15A:
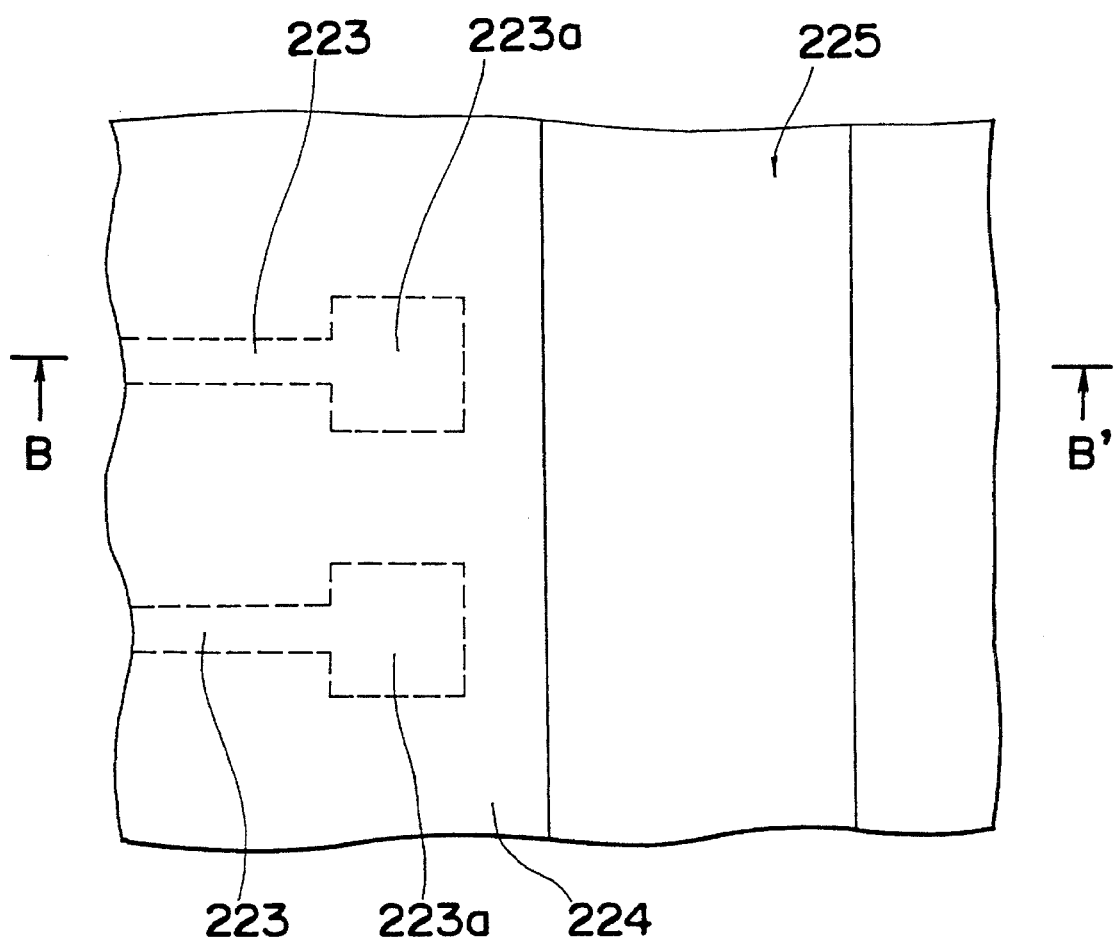
FIG. 15a is a top plan view showing a fabrication process of the semiconductor apparatus shown in FIG. 14.
Figure 15B:
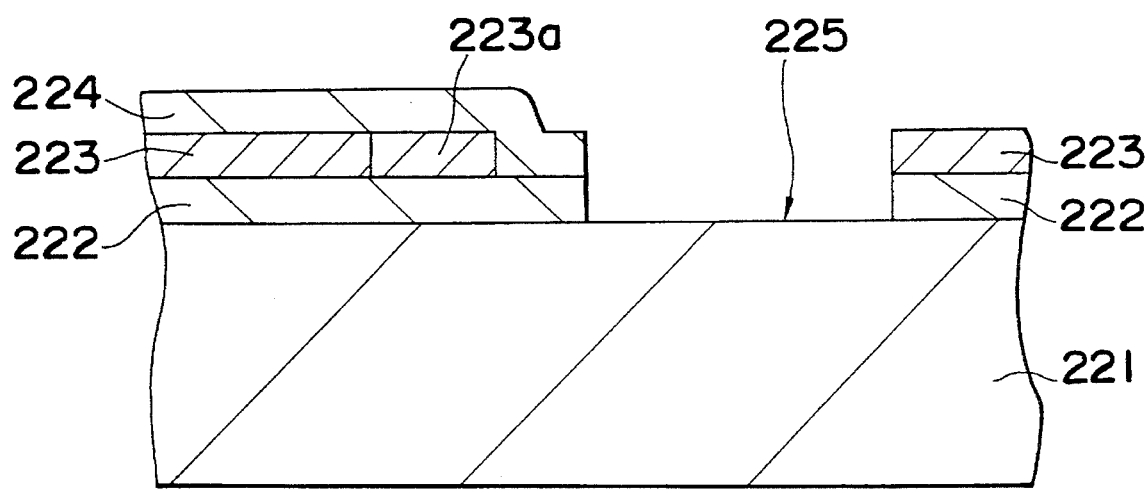
Figure 16A:
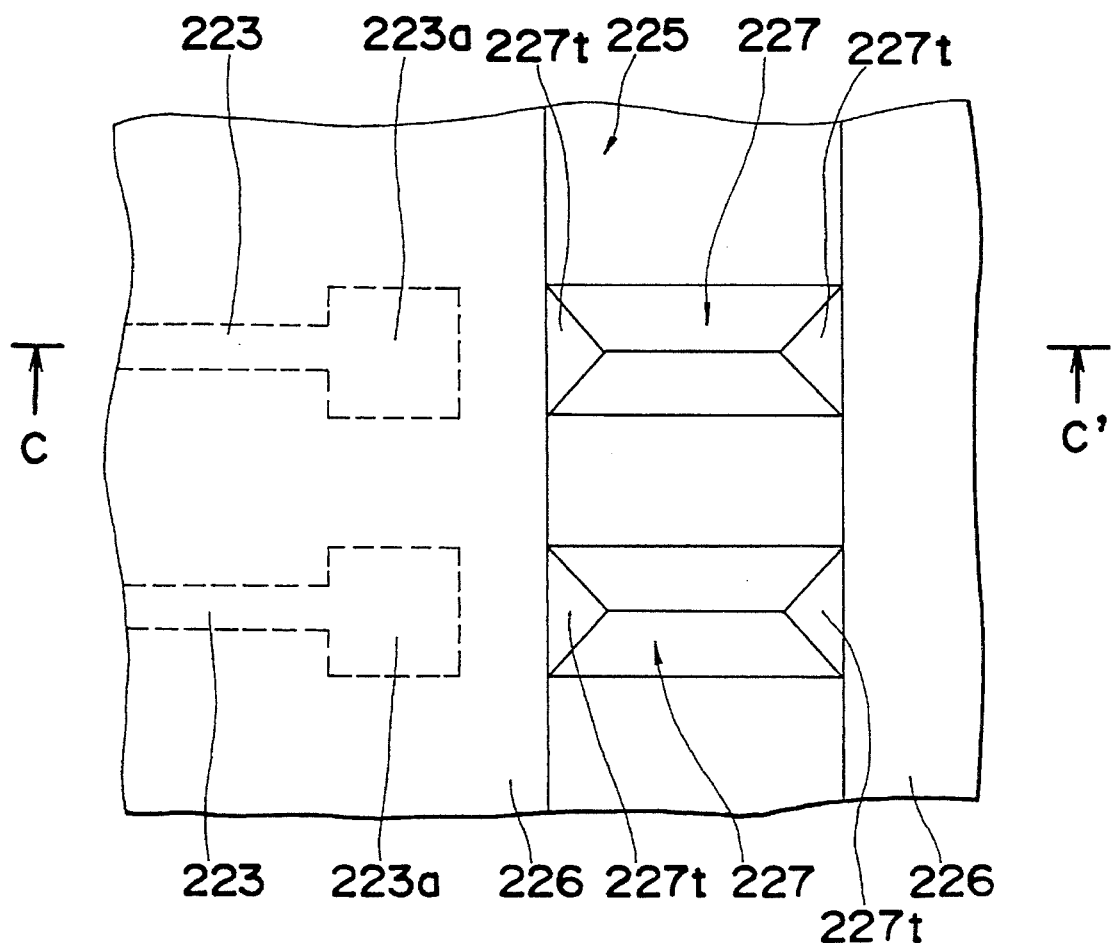
FIG. 16a is a top plan view showing a fabrication process of the semiconductor apparatus shown in FIG. 14.
Figure 16B:
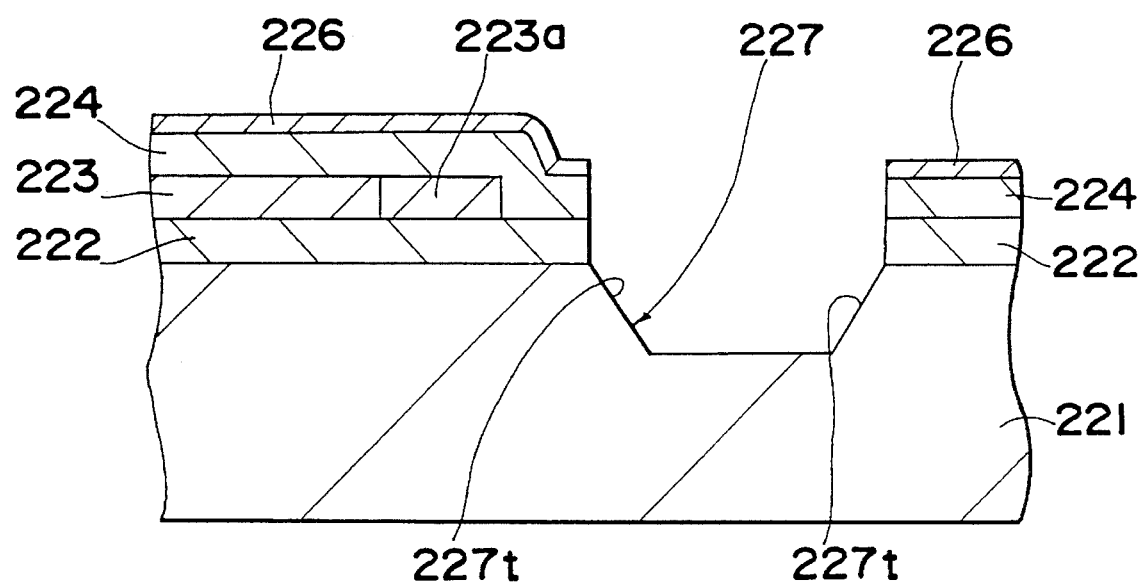
Figure 17A:
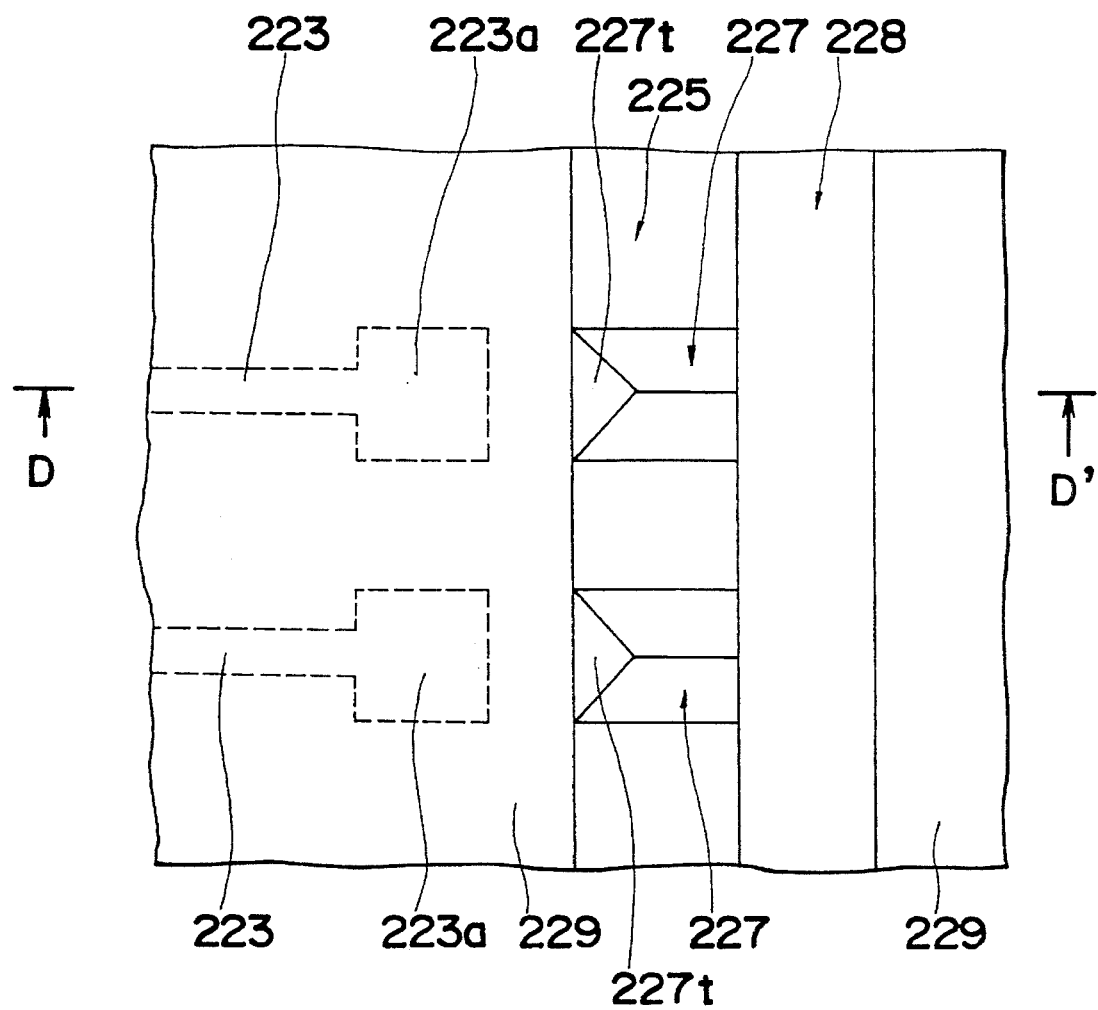
FIG. 17a is a top plan view showing a fabrication process of the semiconductor apparatus shown in FIG. 14.
Figure 17B:
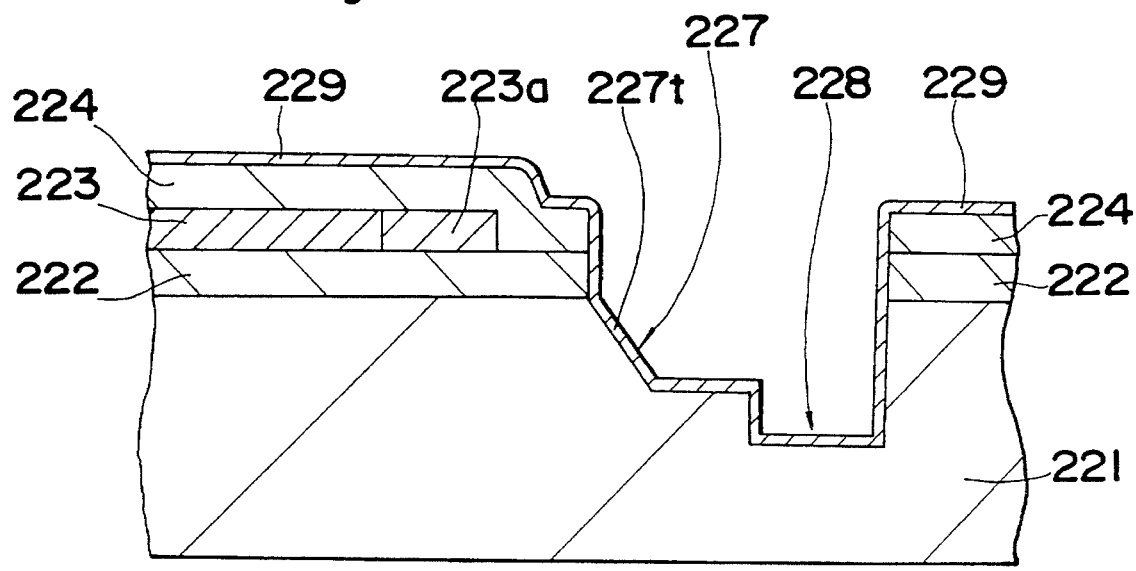

Referring to FIGS. 15a and 15b, the insulating film 222, the interconnection film 223, the protection film 224 and the integrated circuit components (not shown) are formed on the top surface of the silicon substrate 221 of the silicon single crystal having a surface orientation of (100), in the manner similar to that of the eighth preferred embodiment. The insulating film 222 and the protection film 224 which are located on the chip boundary 225 are removed. After the multilayer metal film 226 is formed on substantially the whole surface of the insulating substrate 221, a resist pattern having rectangular holes located on the chip boundary 225 is formed thereon, and then, the multilayer metal film 226 is etched using the resist pattern as a mask so as to have a predetermined pattern.

Figure 18A:
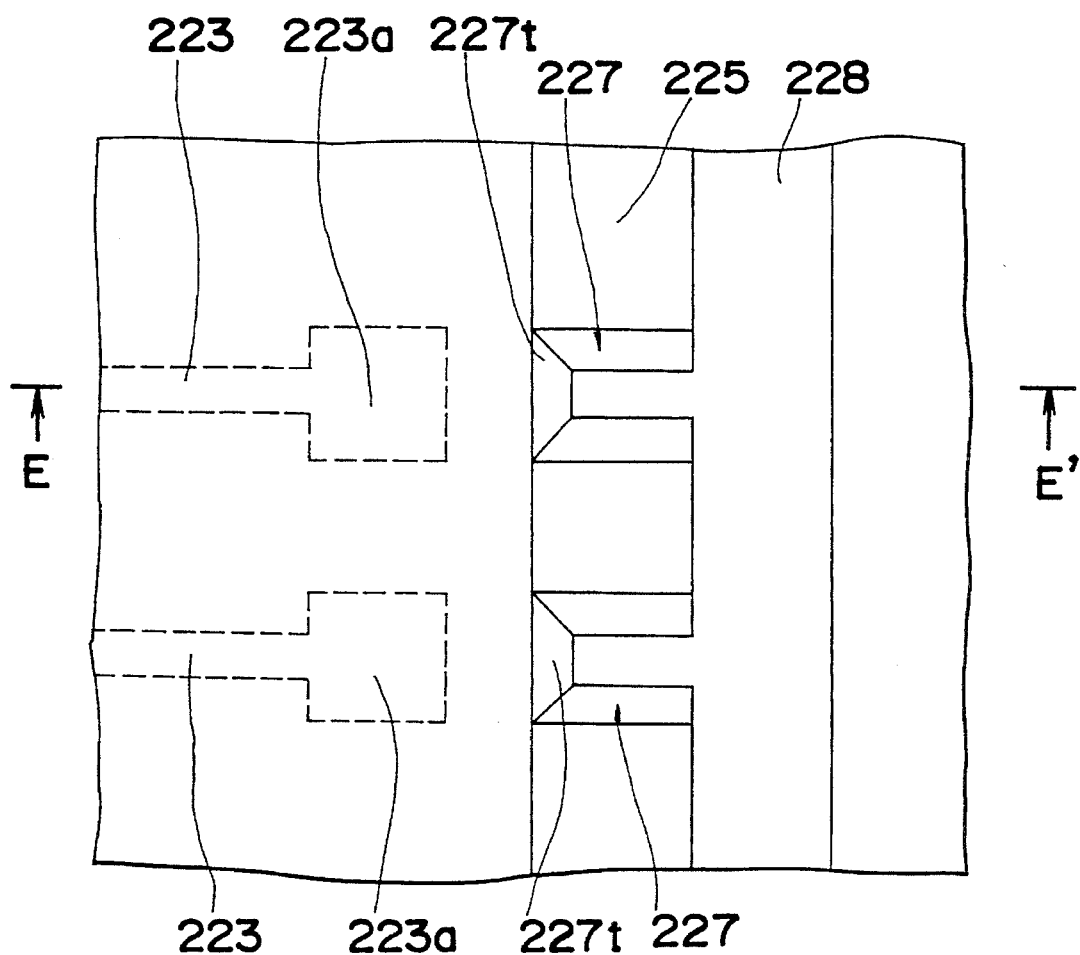
FIG. 18a is a top plan view showing a fabrication process of the semiconductor apparatus shown in FIG. 14, when an adhesive layer and a protection substrate are not formed.
Figure 18B:
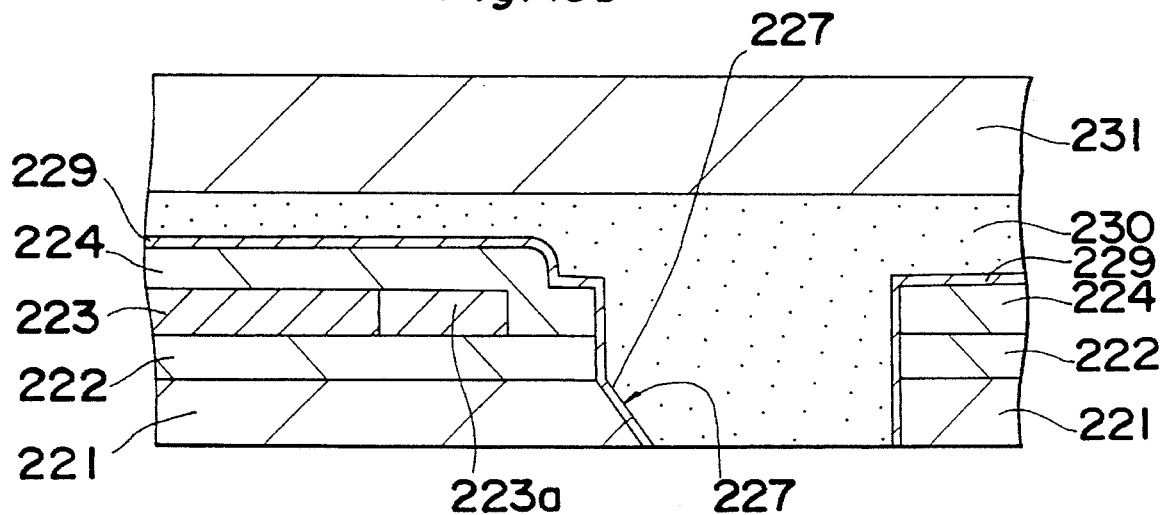
FIG. 18b is a cross-sectional view taken on a line E—E' of FIG. 18a, when the adhesive layer and the protection substrate are formed.

Thereafter, the resist pattern is completely removed, and then, the exposed top surface of the silicon substrate 221 of silicon single crystal which is located on the chip boundary 225 is etched using the multilayer metal film 226 as a mask by the anisotropy etching method using KOH liquid, so as to form recesses 227 having taper portions formed, and FIG. 18b is a cross-section view taken on a line E—E' of FIG. 18a when the adhesive layer 230 and the protection substrate 231 are formed.

Figure 19A:
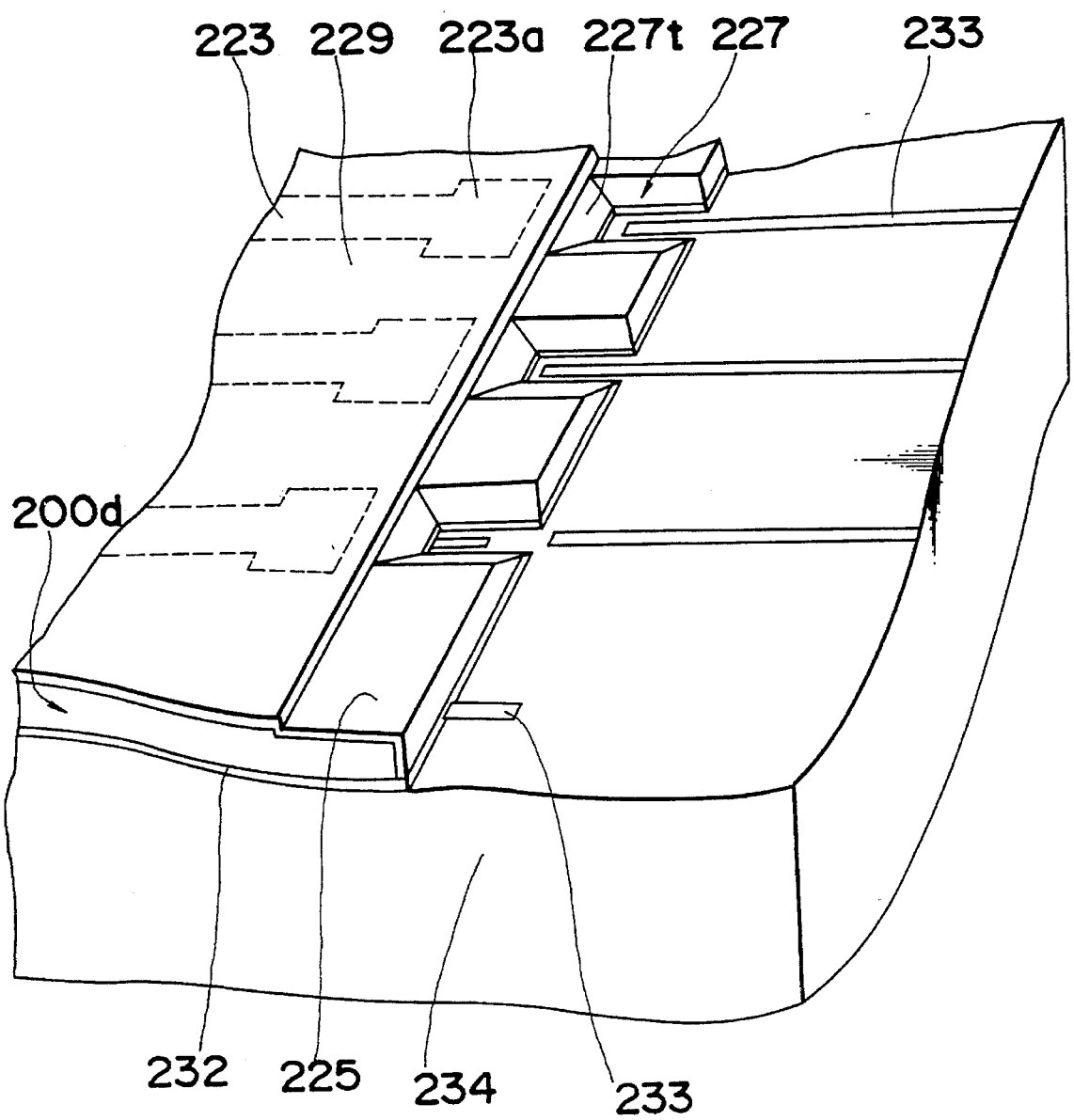
FIGS. 19a to 19d are schematic perspective views showing a fabrication process of the semiconductor apparatus shown in FIG. 14.

Thereafter, referring to FIG. 19a, the semiconductor apparatus on which the protection substrate 231 is bonded is diced so as to be divided into respective chips, and then, nondefective chips are picked up among the divided chips. Thereafter, the bottom surface of a nondefective chip (referred to as a chip 200d hereinafter) is coated with an adhesive such as epoxy resin, or polyimide so as to form an adhesive layer 232, and the nondefective chip 200d is bonded on a predetermined position of the electrically insulating substrate 234. The insulating substrate 234 is similar to that of the eighth preferred embodiment, which has the interconnection film 22 formed on the top surface. After bonding the chip 200d on the insulating substrate 234, the adhesive layer 230 is melted by heating it. Then, the protection substrate 231 is removed so as to be separated from the chip 200d, as shown in FIG. 19a.

Figure 19B:
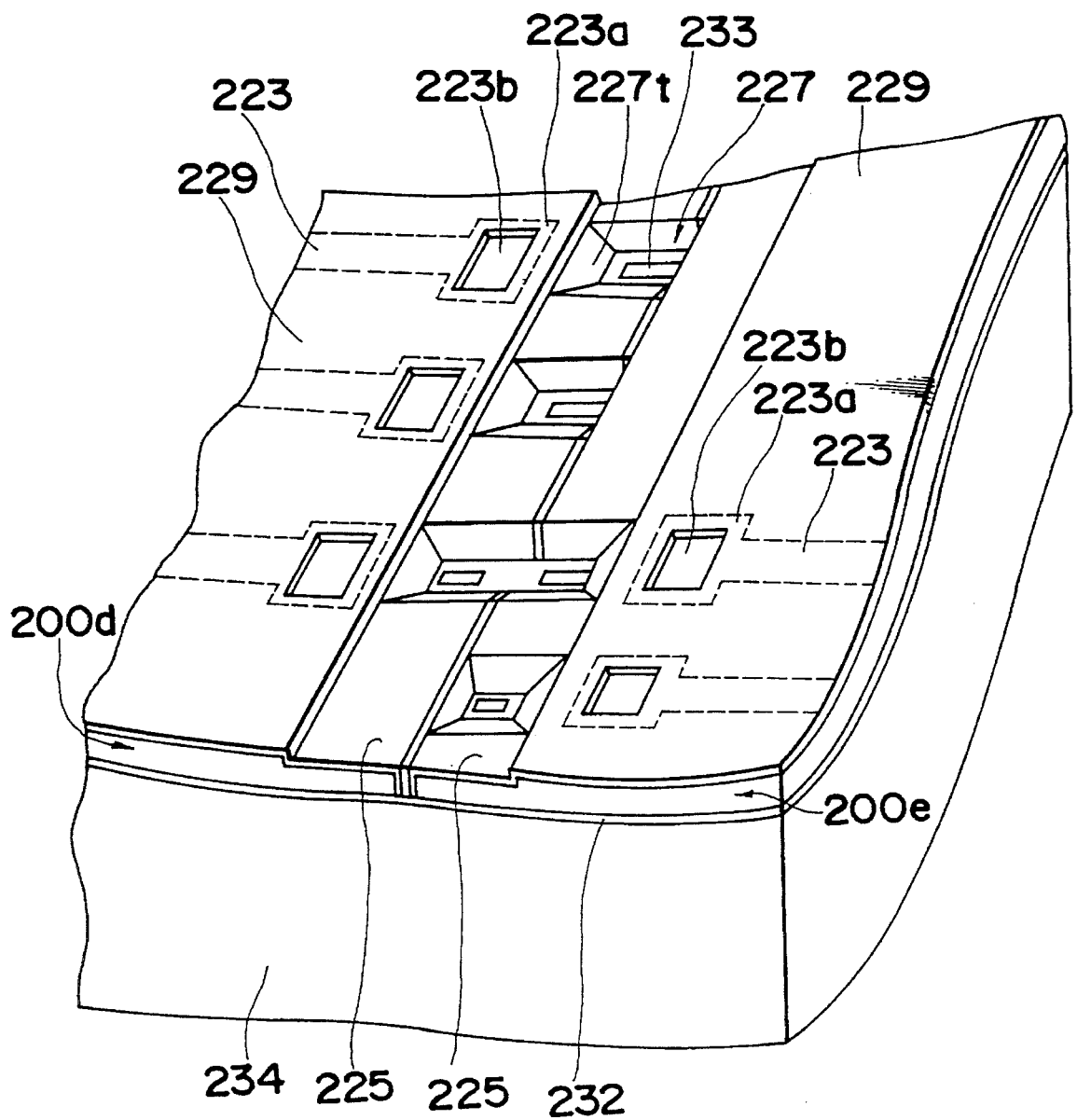

Referring to FIG. 19b, in the manner similar to that described above, another nondefective chip 200e, which has the protection substrate 231 bonded thereon, is bonded on the insulating substrate 234 through the adhesive layer 232, and then, the protection substrate 231 thereof is removed, similarly. Furthermore, all the necessary chips are bonded on the insulating substrate 234 in a similar manner. Thereafter, respective predetermined portions of the protection film 224 and the insulating film 229 are etched so as to form holes 223b therein, as shown in FIG. 19b. As a result, a predetermined portion of the top surface of the connection pad 223a located under the protection film 224 is exposed.

Figure 19C:
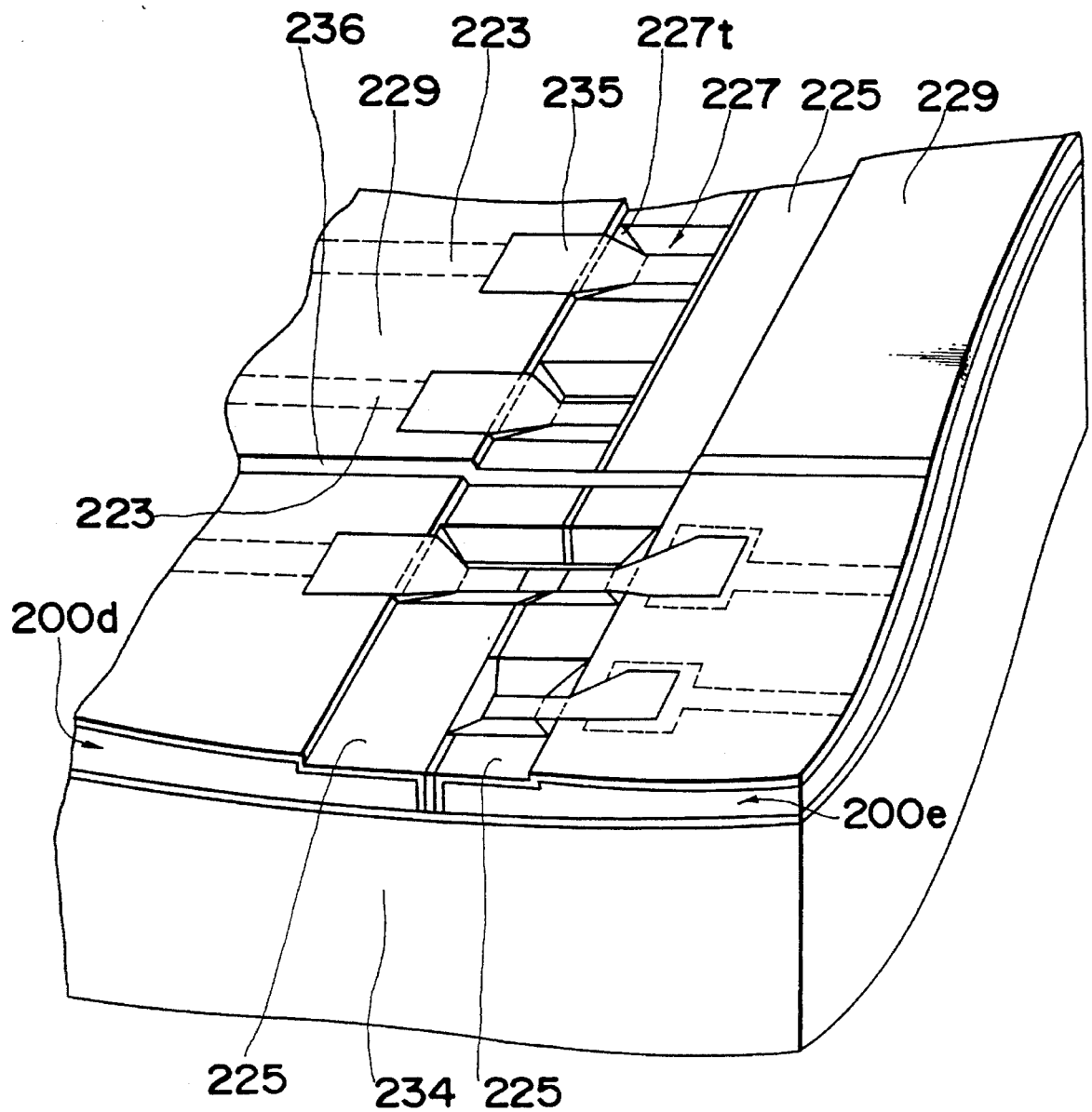

Thereafter, as shown in FIG. 19c, on respective top surfaces of the insulating film 229 and the interconnection film 233 and the taper portion 227t of each hole 227 located on the side surface of each chip, there are formed not only an electrically conductive film 235 for connecting the connection pad 223a of each chip to the interconnection film 233 formed on the insulating substrate 234 but also an interconnection film 236 by the sputtering method and the photoetching method. The conductive film 235 is preferably made of an electrically conductive material such as TiAu, or CrAu. Since the conductive film 235 is formed on the taper portion 227t located on the side surface of each chip, the conductive film 235 can be prevented from being disconnected.

Figure 19D:
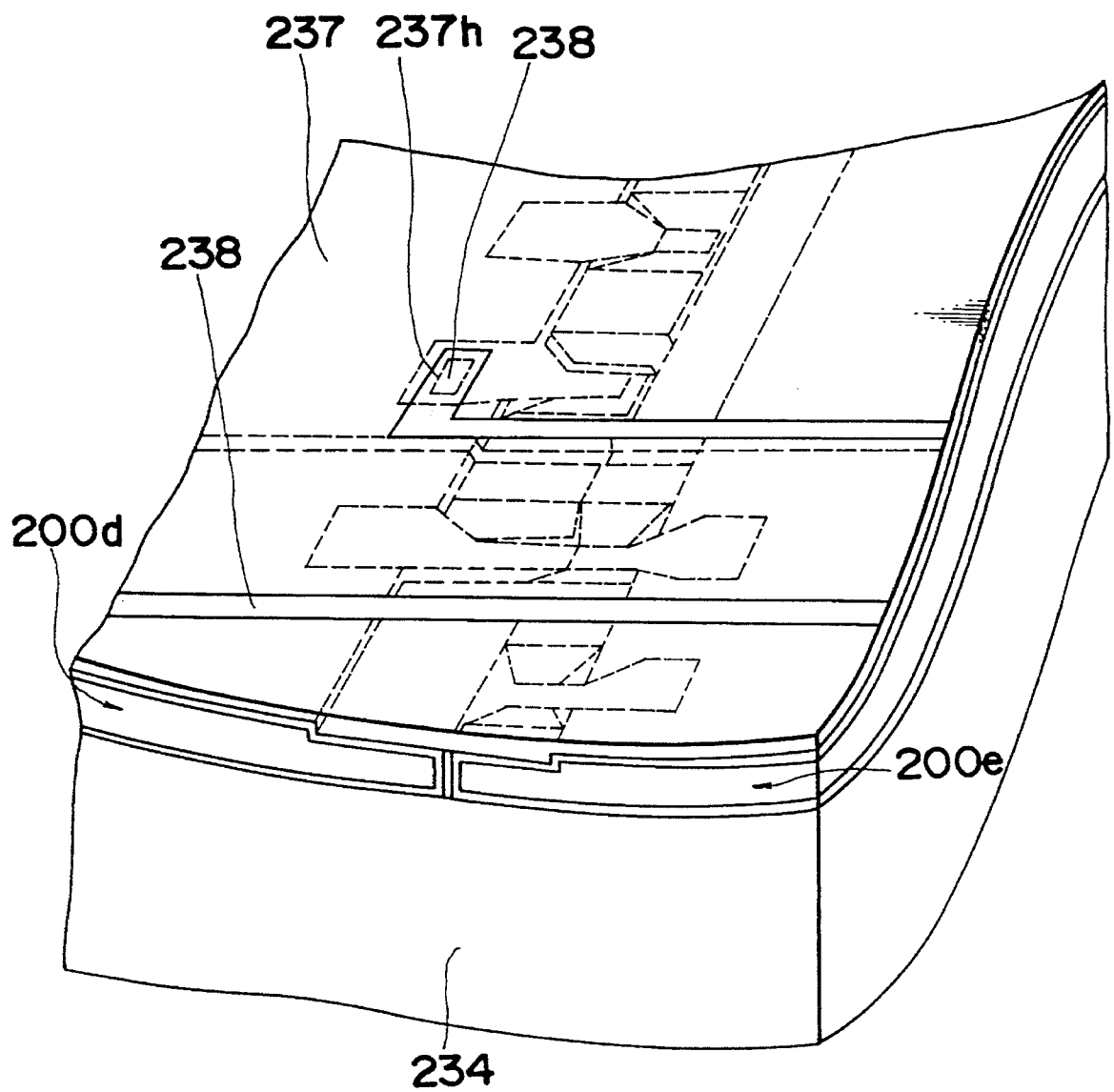

Thereafter, referring to FIG. 19d, an electrically insulating film 237 is formed thereon, and then, a hole 237 for connecting the interconnection film 223 to an interconnection film 238 is formed in the insulating film 237. Finally, the interconnection film 238 is formed thereon, which results in the desirable semiconductor apparatus of the ninth preferred embodiment shown in FIG. 14.

In the present preferred embodiment, as described above, because the interconnection films of each chip can be electrically connected to the interconnection film 212 formed on the substrate 234 through the conductive film 235 formed on the taper portion 227t located on the side surface of each chip, the design of the circuit for connecting the interconnection film 233 formed on the insulating substrate 234 to the integrated circuit formed on each chip can be designed more freely, and also the length of each interconnection film can be decreased. Therefore, the integrated circuit thereof can handle signals having higher frequencies, the noise caused therein can be lowered, and the power consumption thereof can be lowered. Further, the cost of designing semiconductor apparatuses can be lowered, and the time required for designing a semiconductor apparatus can be reduced.

In the present preferred embodiment, there is formed the recess 227 having the taper portion 227t on the predetermined portion located on the side surface of each chip, and the interconnection film 233 formed on the insulating substrate 234 is electrically connected to the interconnection film 223 formed on each chip through the conductive film 235. However, the aforementioned connection between the interconnection film 233 formed on the insulating substrate 234 and the interconnection film 223 formed on each chip may be performed at any position of the side surface of each chip without shaping the side surface of each chip.

Tenth Preferred Embodiment

Figure 20:
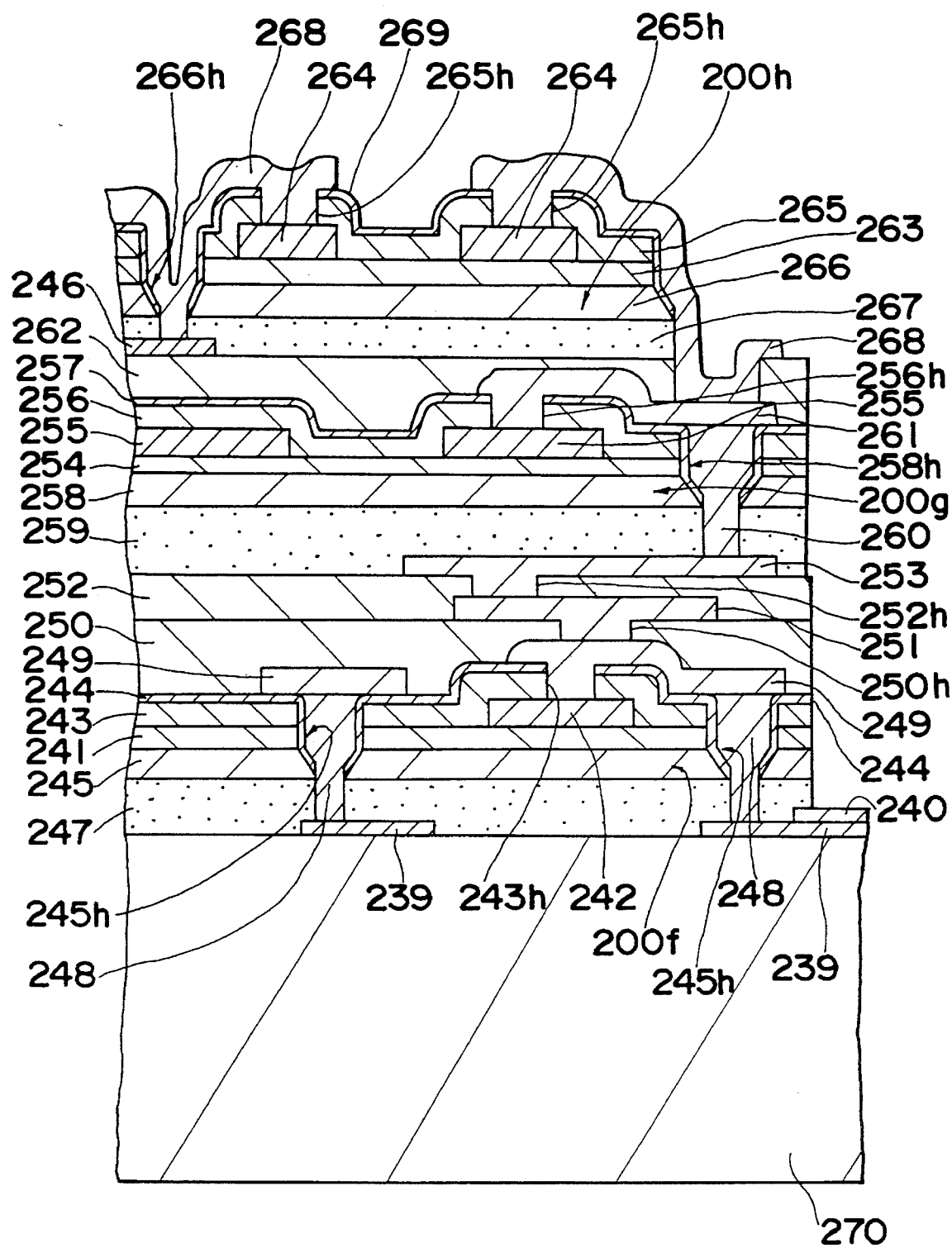
FIG. 20 is a cross-sectional view showing a semiconductor apparatus of a tenth preferred embodiment according to the present invention.

FIG. 20 is a cross-sectional view showing a semiconductor apparatus of a tenth preferred embodiment according to the present invention. The semiconductor apparatus thereof is characterized in that semiconductor chips 200f to 200h are arranged on an electrically insulating substrate 270 so as to be stacked in a three-layer structure.

Referring to FIG. 20, on the top surface of the insulating substrate 270 on which an interconnection film 239 is formed, a semiconductor chip 200f having through holes 245h is bonded through an adhesive layer 247. The semiconductor chip 200f includes an interconnection film 242 formed on an electrically insulating film 241 which is formed on a silicon substrate 245 of silicon single crystal, and various kinds of integrated circuit components (not shown) formed on the silicon substrate 245 through the interconnection film 242. The interconnection film 242 and the integrated circuit components are coated with a protection film 243 and an electrically insulating film 244, and a hole 243h is formed in a predetermined portion of the protection film 243 and the insulating film 244 so as to reach the interconnection film 242. The interconnection film 242 is in contact with an interconnection film 249 formed on the insulating film 244 through the hole 243h, and the interconnection film 249 is in contact with an electrically conductive body 248 stuffed in the through hole 245h. Further, the conductive body 248 is in contact with an interconnection film 239 formed on the top surface of the insulating substrate 270. Therefore, the interconnection film 242 formed on the semiconductor chip 200f is connected to the interconnection film 239 formed on the insulating substrate 270 through the interconnection film 249 and the conductive body 248.

On the top surface of the semiconductor chip 200f, there are formed an electrically insulating film 250 of a resin such as polyimide, an electrically insulating film 252, and an interconnection film 253 in this order so as to be stacked. In respective predetermined portions of the insulating films 250 and 252, there are formed holes 250h and 253h, and the interconnection films 249, 251 and 253 are electrically connected to each other through the holes 250h and 253h.

Furthermore, semiconductor chips (not shown) similar to the semiconductor chip 200f and/or mediation chips (not shown) are bonded on the insulating substrate 270 through the adhesive layer 247. In the area where any chip is not bonded on the insulating substrate 270, the interconnection film 239 formed on the insulating substrate 270 is coated with a protection film 240.

On the top surface of each insulating film 252 of these chips including the semiconductor chip 200f, there are bonded a semiconductor chip 200g similar to the semiconductor chip 200f, the other semiconductor chips and/or a mediation chip through an adhesive layer 259. The semiconductor chip 200g includes an electrically insulating film 254, and an electrically insulating film 257, which are formed in this order so as to be stacked on a silicon substrate 258 of silicon single crystal. The interconnection film 255 is electrically connected to an interconnection film 261 formed on the insulating film 257 through a hole 256h formed in the protection film 256 and the insulating film 257. The interconnection film 261 is electrically connected to the interconnection film 253 formed on the lowest layer semiconductor chip 200f through an electrically conductive body 260 stuffed in a through hole 258h.

Furthermore, on the top surface of the insulating film 262 of these chips including the semiconductor chip 200g, there is bonded a semiconductor chip 200h similar to that of the ninth preferred embodiment through an adhesive layer 267. The semiconductor chip 200h includes an electrically insulating film 263, an interconnection film 264, a protection film 265, and an electrically insulating film 269, which are formed in this order so as to be stacked on a silicon substrate 266 of silicon single crystal. The interconnection film 264 is in contact with an electrically conductive film 268 formed on both of the insulating film 269 and the side surface of the semiconductor chip 200h through a hole 266h formed in the insulating film 269 and the protection film 263. The interconnection film 264 formed on the semiconductor chip 200h is electrically connected to the interconnection film 261 formed on the middle layer semiconductor chip 200g through the conductive film 268.

Therefore, the interconnection film 264 of the highest layer semiconductor chip 200h is electrically connected to the interconnection film 255 of the middle layer semiconductor chip 200g through the conductive film 268 and the interconnection film 261, and is further electrically connected to the interconnection film 242 of the lowest layer semiconductor chip 200f through the conductive body 260, and the interconnection films 253, 251 and 249.

Furthermore, if necessary upon designing the integrated circuits, the conductive film 268 is electrically connected to the interconnection film 246 formed on the insulating film 262.

As described above, in the present preferred embodiment, various semiconductor chips similar to that of the eighth and ninth preferred embodiments, the other kinds of chips, and/or mediation chips are bonded in a multilayer structure on the insulating substrate 270, and the integrated circuits of each chip are electrically connected to the integrated circuits of the lower or higher layer chip either through the conductive body or film formed in the through hole, or through the conductive body or film formed on the side surface of each chip. Therefore, the degree of the integration of the circuit components can be further enhanced, and the semiconductor apparatus can be further miniaturized.

In the present preferred embodiment, the chips are arranged in the three-layer structure on the insulating substrate 270, however, the present invention is not limited to this. The chips may be arranged in a multilayer structure such as a two-layer structure, or a four or more -layer structure.

In the present preferred embodiment, the semiconductor chip similar to that of the eighth preferred embodiment is used as the lowest and middle layer chips, and the semiconductor chip similar to that of the ninth preferred embodiment is used as the highest layer chip, however, the present invention is not limited to this. Any kind of chips may be used as each layer chip.

Modifications

In the preferred embodiments, the silicon wafer or substrate of silicon single crystal is used, however, the present invention is not limited to this. The present invention can be applied to a GaAs wafer or substrate, and an InP wafer or substrate.

In the first to third preferred embodiments, one substrate is processed, however, the present invention is not limited to this. A plurality of substrates associated with each other may be processed, whereby the number of the fabrication processes can be decreased, and the fabrication cost can be lowered.

In the fourth and fifth preferred embodiments, there is inclined the side surfaces of each semiconductor chip on which there is formed each of the conductive films 64, 67 and 71 for leading the electrode films into the top surface of the substrate in order to prevent the disconnection thereof, however, the present invention is not limited to this. When the thickness of the silicon wafer is decreased, there can be formed the side surfaces of each semiconductor chip substantially perpendicular to the top surface of the substrate, on which each of the conductive films 64, 67 and 71 can be formed.

In the sixth and seventh preferred embodiments, the side surfaces of each chip are coated with the insulating film, however, the present invention is not limited to this. The side surfaces of each chip may not be coated.

In the sixth and seventh preferred embodiments, the mediation chip 100A is made of silicon, however, the present invention is not limited to this. The mediation chip 100A may be made of any electrically insulating material such as glass, or ceramic.

In the sixth and seventh preferred embodiments, two-layer interconnection films are formed on the assembled chip 100A, however, the present invention is not limited to this. Multilayer interconnection films may be formed thereon.

It is to be noted that the thickness and length of each of the films and components shown in all the Figs. does not represent the actual thickness and length.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A method for forming a semiconductor apparatus, comprising the steps of:

(a) separately forming a plurality of electrically conductive interconnection films of a predetermined pattern on an electrically insulating circuit substrate;

(b) bonding at least one semiconductor chip having a plurality of electrodes through an adhesive layer on said circuit substrate and said interconnection films;

(c) forming a plurality of through holes in said semiconductor chip which pierce said semiconductor chip in the direction of thickness thereof; and (d) forming a plurality of electrically conductive bodies in each of said through holes respectively, each of said plurality of electrically conductive bodies electrically connecting a predetermined one of said electrodes of said semiconductor chip to a predetermined one of said interconnection films formed on said circuit substrate, wherein each of said plurality of electrically conductive bodies is electrically connected directly to said predetermined one of said interconnection films on the bottom plane of each of said through holes.

2. The method as claimed in claim 1, wherein each of said conductive bodies is disposed in each of said through holes at said step (d).

3. A method for forming a semiconductor apparatus, comprising the steps of:

(a) separately forming a plurality of electrically conductive interconnection films of a first predetermined pattern on an electrically insulating circuit substrate;

(b) bonding at least one semiconductor chip having a plurality of electrodes through an adhesive layer on said circuit substrate and said interconnection films so that a top surface and inclined side surfaces of each of said semiconductor chips are exposed; and (c) separately forming a plurality of first electrically conductive films of a second predetermined pattern on said top surface and said inclined side surface of each of said semiconductor chips and a top surface of said circuit substrate, each of said plurality of first electrically conductive films electrically connecting a predetermined one of said electrodes of said semiconductor chip to a predetermined one of said interconnection films formed on said circuit substrate.

4. The method as claimed in claim 3, further comprising the steps of:

(d) bonding first and second semiconductor chips through each adhesive layer on said circuit substrate so that respective top surface and respective inclined side surfaces of said first and second semiconductor chips are exposed are adjacent to each other; and (e) forming at least one second electrically conductive film on respective top surfaces and respective side surfaces of said first semiconductor chip and said second semiconductor chip and a top surface of said circuit substrate for electrically connecting a predetermined one of said electrodes of said first semiconductor chip to a predetermined one of said electrodes of a second semiconductor chip.

5. The method as claimed in claim 1, wherein said step (b) comprises the step of bonding at least one of said electrodes of said semiconductor chip to said interconnection films through an adhesive layer and subsequently etching to remove a portion of said adhesive layer located beneath said through holes.

6. A semiconductor apparatus comprising:

an electrically insulating circuit substrate;

a plurality of electrically conductive interconnection film of a predetermined pattern separately formed on said circuit substrate;

at least one semiconductor chip having a plurality of electrodes, said semiconductor chip being bonded through an adhesive layer on said circuit substrate and said interconnection films;

a plurality of through holes formed in said semiconductor chip so as to pierce said semiconductor chip in the direction of the thickness thereof; and a plurality of electrically conductive bodies formed in each of said through holes, respectively, each of said conductive bodies electrically connecting a predetermined one of said electrodes of said semiconductor chip to a predetermined one of said interconnection films formed on said circuit substrate, wherein each of said conductive bodies is electrically connected directly to said predetermined one of said interconnection films formed on said circuit substrate on the bottom plane of each of said plurality of through holes and each of said conductive bodies is disposed in each of said through holes.

7. A semiconductor apparatus comprising:

an electrically insulating circuit substrate;

a plurality of electrically conductive interconnection films of a first predetermined pattern separately formed on said circuit substrate;

at least one semiconductor chip having a top surface and inclined side surfaces and a plurality of electrodes, said semiconductor chip being bonded through an adhesive layer on said circuit substrate and said interconnection films so that said top surface and said inclined surfaces of each of said semiconductor chips are exposed; and a plurality of first electrically conductive films of a second predetermined pattern separately formed on said top surface and said respective inclined side surfaces of each of said semiconductor chips, each of said first conductive films electrically connecting a predetermined one of said electrodes of said semiconductor chip to a predetermined one of said interconnection films formed on said circuit substrate, by leading said first conductive film from said one predetermined electrode through said top surface and said inclined surface of each of said semiconductor chips to said predetermined one of said interconnection films of said circuit substrate.

8. A semiconductor apparatus comprising:

an electrically insulating circuit substrate;

electrically conductive interconnection films of a first predetermined pattern separately formed on said circuit substrate;

a plurality of semiconductor chips bonded through respective adhesive layers so as to be stacked on said circuit substrate, each of said plurality of semiconductor chips having a top surface, inclined side surfaces and a plurality of electrodes; and electrical connection means of a second predetermined pattern formed on said top surface and said inclined side surface of each of said semiconductor chips, said electrical connection means electrically connecting a predetermined one of said electrodes of each of said semiconductor chips to a predetermined one of interconnection films formed on another one of said semiconductor chips.

9. The semiconductor apparatus as claimed in claim 8, further comprising:

a plurality of through holes formed in a predetermined one of said semiconductor chips so as to pierce said predetermined one of said semiconductor chips in the direction of the thickness thereof; and a plurality of electrically conductive bodies formed in each of said through holes, respectively, each of said conductive bodies electrically connecting a predetermined one of said electrodes of said semiconductor chip to a predetermined one of interconnection films formed on another one of said semiconductor chips, wherein each of said conductive bodies is electrically connected directly to said predetermined one of said interconnection films formed on another one of said semiconductor chips, on the bottom plane of each of said plurality of through holes and each of said conductive bodies is disposed in each of said through holes.

10. The method of claim 1, wherein in step (d) each one of the plurality of electrically conductive bodies are electrically directly connected to said predetermined one of said interconnection films by direct physical contact of each one of the plurality of electrically conductive bodies to said predetermined one of said interconnection films.

* * * * *